US009842645B2

(12) United States Patent
Tezuka et al.

(10) Patent No.: US 9,842,645 B2
(45) Date of Patent: Dec. 12, 2017

(54) NONVOLATILE MEMORY DEVICE INCLUDING NONVOLATILE MEMORY AND RESISTANCE-TIME CONVERTER, AND INTEGRATED CIRCUIT CARD INCLUDING NONVOLATILE MEMORY DEVICE

(71) Applicant: Panasonic Intellectual Property Management Co., Ltd., Osaka (JP)

(72) Inventors: Hiroyuki Tezuka, Kyoto (JP); Yoshikazu Katoh, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/450,648

(22) Filed: Mar. 6, 2017

(65) Prior Publication Data
US 2017/0294227 A1 Oct. 12, 2017

(30) Foreign Application Priority Data

Apr. 8, 2016 (JP) .................................. 2016-078489

(51) Int. Cl.
*G11C 11/00* (2006.01)
*G11C 13/00* (2006.01)
*G06F 3/06* (2006.01)

(52) U.S. Cl.
CPC ............ *G11C 13/004* (2013.01); *G06F 3/061* (2013.01); *G06F 3/0625* (2013.01);
(Continued)

(58) Field of Classification Search
CPC .............. G11C 13/004; G11C 13/0026; G11C 13/0061; G11C 13/0097; G06F 3/061; G06F 3/0625
(Continued)

(56) References Cited

U.S. PATENT DOCUMENTS

| 5,128,624 | A | 7/1992 | Hoshino et al. | |
| 6,795,355 | B2 * | 9/2004 | Ooishi | G11C 5/147 365/158 |

(Continued)

FOREIGN PATENT DOCUMENTS

| JP | 3-220814 | 9/1991 |
| JP | 2003-257173 | 9/2003 |

(Continued)

*Primary Examiner* — Huan Hoang
(74) *Attorney, Agent, or Firm* — McDermott Will & Emery LLP

(57) ABSTRACT

A nonvolatile memory device comprises: a nonvolatile memory; a resistance-time converter that outputs an end signal at timing according to a resistance value of the nonvolatile memory; and a time-digital converter that measures the time from input of a start signal to input of the end signal and converts the measured time into a digital value. The time-digital converter includes: a ring delay circuit that includes delay elements connected in a ring configuration; a counter circuit that counts the number of times of a rising edge or a falling edge in output of one of the delay elements; a first memory circuit that stores, based on the end signal, outputs of the delay elements as first data; and a second memory circuit that stores, based on the end signal, a count value of the counter circuit as second data.

20 Claims, 26 Drawing Sheets

(52) U.S. Cl.
CPC .......... *G06F 3/0653* (2013.01); *G06F 3/0679* (2013.01); *G11C 13/0026* (2013.01); *G11C 13/0061* (2013.01); *G11C 13/0097* (2013.01)

(58) Field of Classification Search
USPC ........................................................ 365/148
See application file for complete search history.

(56) References Cited

U.S. PATENT DOCUMENTS

| | | | |
|---|---|---|---|
| 6,813,177 B2 * | 11/2004 | Lowrey ............... | G11C 11/5642 365/113 |
| 2005/0024950 A1 | 2/2005 | Sakimura et al. | |
| 2010/0271525 A1 | 10/2010 | Takahashi | |
| 2015/0213885 A1 * | 7/2015 | Katoh ................ | G11C 13/0007 365/148 |
| 2015/0220457 A1 | 8/2015 | Katoh et al. | |
| 2015/0301802 A1 | 10/2015 | Katoh | |
| 2015/0364192 A1 | 12/2015 | Yoshimoto et al. | |

FOREIGN PATENT DOCUMENTS

| | | |
|---|---|---|
| JP | 2010-258817 | 11/2010 |
| JP | 2015-212933 | 11/2015 |
| JP | 2016-015192 | 1/2016 |
| WO | 2014/132662 | 9/2014 |

* cited by examiner

NONVOLATILE MEMORY DEVICE INCLUDING NONVOLATILE MEMORY AND RESISTANCE-TIME CONVERTER, AND INTEGRATED CIRCUIT CARD INCLUDING NONVOLATILE MEMORY DEVICE

BACKGROUND

1. Technical Field

The present disclosure relates to a variable-resistance nonvolatile memory device.

2. Description of the Related Art

There has been a rapid expansion in the market for electronic commerce services carried out via the Internet, such as Internet banking and Internet shopping. Electronic money is used as a payment method at such time, and there has likewise been an expansion in the use of integrated circuit ("IC", hereinafter the same) cards and smartphone terminals that are used as media therefor. For safety when making payments, these services ordinarily require a higher level of security technology for mutual authentication during communication and encryption of communication data. Generally, in an IC having enhanced security, confidential information is used in an encrypted manner by using an encryption circuit mounted therein and information leaks are prevented. In this case, it is essential that information regarding an encryption key (also referred to as a "secret key") that is retained internally is not leaked to the outside.

In order to address these issues, physically unclonable function (PUF) technology has been proposed. PUF technology uses manufacturing variations to generate unique solid identification information that is different for each IC. Hereinafter, solid identification information generated by means of PUF technology will be referred to as "digital ID data" in the present specification. Digital ID data can be said to be random number data that is characteristic to each device and associated with variations in the physical characteristics of ICs. These physical characteristics cannot be artificially controlled for each IC, and it is therefore possible to generate data that cannot be physically replicated (for example, see Japanese Patent No. 5689571).

Furthermore, disposable secret keys which use true random numbers that cannot be predicted are employed when generating encryption keys (for example, see Japanese Unexamined Patent Application Publication No. 2015-212933). A true random number (physical random number) refers to a random number that is generated by using the physical phenomenon of intrinsically having random properties, such as the thermal noise within a semiconductor device, for example. In this way, a true random number is not reproducible and cannot be predicted by anyone, and therefore encryption that is carried out using a secret key generated using a true random number has a high degree of safety.

In Japanese Patent No. 5689571, a method is given in which variation in a resistance value inherent to a nonvolatile memory is used as digital ID data. Furthermore, in Japanese Unexamined Patent Application Publication No. 2015-212933, temporal fluctuation in a resistance value of a nonvolatile memory is used as a true random number source.

In order to increase the read speed when reading the resistance value of a nonvolatile memory, it is necessary for capacitance charge to be discharged quickly, and for a time measurement counter to be operated at high speed. However, with an IC card, it is necessary for various types of functions to be executed within a short period of time using power provided by a wireless power supply that is obtained during communication, and extremely low power saving and high-speed generation are required at the same time. Power consumption increases when a time measurement counter is operated at high speed, and there is a possibility that a wireless power supply will no longer be sufficient.

SUMMARY

In one general aspect, the techniques disclosed here feature a nonvolatile memory device provided with: a first nonvolatile memory that stores information in association with a resistance value thereof; a first resistance-time converter that outputs a first end signal at timing according to the resistance value of the first nonvolatile memory, the first resistance-time converter being connected to the first nonvolatile memory; and a time-digital converter that converts a first time from input of a start signal to input of the first end signal into a first digital value. The time-digital converter includes: a ring delay circuit that includes delay elements connected in a ring configuration; a counter circuit that counts the number of times of a rising edge or the number of times of a falling edge in output of one of the delay elements; a first memory circuit that stores, based on the first end signal, outputs of the delay elements as first data; and a second memory circuit that stores, based on the second end signal, a count value of the counter circuit as second data.

Comprehensive and specific aspects of the aforementioned may be implemented using a system, a method, and a computer program, or may be realized using a combination of a system, a method, and a computer program.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
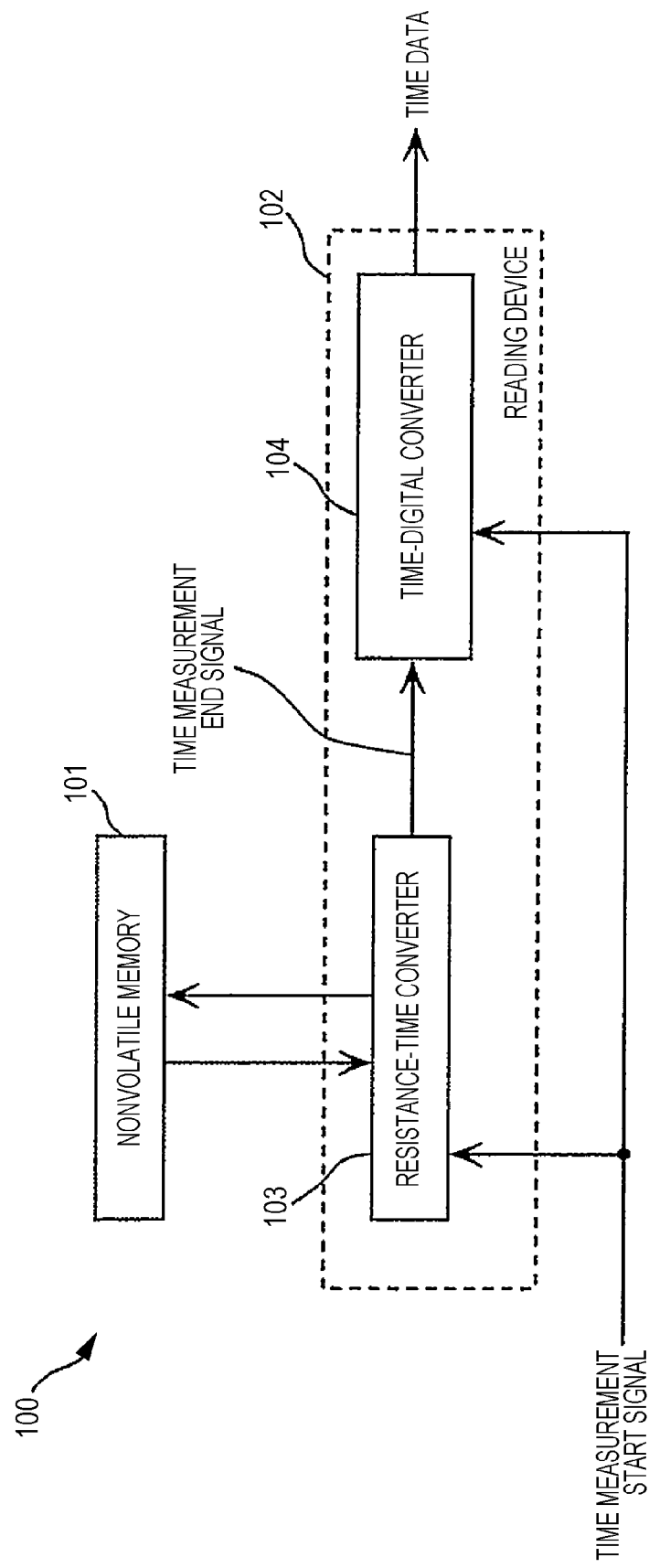
FIG. 1 is a block diagram depicting an example of a basic configuration of a nonvolatile memory device.

Findings Forming the Basis for the Present Disclosure

In Japanese Patent No. 5689571 and Japanese Unexamined Patent Application Publication No. 2015-212933, in a circuit that reads a resistance value of a nonvolatile memory, charge that has been charged in a capacitor up to a fixed voltage is discharged in a resistance of the nonvolatile memory, and the time taken for the charge to fall below a threshold voltage value is measured. In this method, the resistance value is extended as a time so to speak, and an accurate resistance value can be calculated.

A circuit that counts using a clock signal source is adopted as a method for measuring said time. It is also possible to adjust the discharging time by adjusting the capacitance of the capacitor. If the capacitance of the capacitor increases, the discharging time also increases, and therefore the count value increases. Furthermore, if the capacitance of the capacitor decreases, the discharging time decreases, and the count value decreases. The count interval is decided by the clock signal source, and therefore the operating frequency thereof becomes the resolution of a resistance count value. As the capacitance value of the capacitor increases, the discharging time increases, and the resolution of resistance value information with respect to the count value improves. Conversely, as the capacitance value of the capacitor decreases, the discharging time decreases; however, the resolution of the resistance value information with respect to the count value declines.

Furthermore, Japanese Unexamined Patent Application Publication No. 2015-212933 presents a method for generating a true random number with temporal fluctuation in the resistance value of a nonvolatile memory being used as a random property. For the method for reading the resistance value, similar to the case in the aforementioned Japanese Patent No. 5689571, a method is used where the time taken for the charge of a capacitor to be discharged is measured. However, temporal fluctuation in the resistance value of a nonvolatile memory is smaller than variation in a characteristic resistance value, and therefore, with the technology given in Japanese Unexamined Patent Application Publication No. 2015-212933, a higher resolution is required than in the case given in Japanese Patent No. 5689571.

In order to increase the read speed when reading the resistance value of a nonvolatile memory, it is necessary for capacitance charge to be discharged quickly, and for a time measurement counter to be operated at high speed. Mobile electronic money such as the aforementioned IC card is a card that has a semiconductor integrated circuit (IC) chip mounted thereon, and it is desirable for internal digital ID data to be read and a true random number to be generated and applied to a secret key also within the IC card. However, with an IC card, it is necessary for various types of functions to be executed within a short period of time using power provided by a wireless power supply obtained during communication, and extremely low power saving and high-speed generation of a true random number are required at the same time. Power consumption increases when a time measurement counter is operated at high speed, and there is a possibility that a wireless power supply will no longer be sufficient.

Furthermore, it is necessary to increase the key length in order to improve security. However, if the key length is increased, the amount of digital ID data and the amount of random number data increases, and the time for reading the resistance value and generating a random number increases. Furthermore, if mutual authentication and the encryption of communication data take time, there is a resulting deterioration in usability, and it is therefore necessary for encryption to be carried out at high speed. However, when encryption is carried out at high speed, a problem occurs in that current consumption increases.

In a nonvolatile memory device according to an aspect of the present disclosure described hereinafter, it is possible to suppress an increase in current consumption while also improving the digital ID data read speed and the random number generation speed. Furthermore, errors do not occur in acquired resistance value data. Thus, it is possible for digital ID data having excellent security to be generated at high speed and with low power consumption.

A nonvolatile memory device according to an aspect of the present disclosure is provided with: a nonvolatile memory that stores data by determining a resistance value with at least one threshold value; a first conversion circuit that converts the resistance value stored in the nonvolatile memory into time information; and a second conversion circuit that converts the time information into a digital value, in which the second conversion circuit is provided with: a ring delay circuit in which a plurality of delay elements are connected; a counter circuit that measures the number of times that a rising edge or a falling edge occurs in data that is output from any delay element from among the plurality of delay elements; a first memory circuit that saves data that is output from each of the plurality of delay elements; and a second memory circuit that saves data retained in the counter circuit, and the second conversion circuit, on the basis of a time difference from the time at which a time measurement start signal is input to the time at which a time measurement end signal is input, refers to the data saved in the first memory circuit and the data saved in the second memory circuit, and acquires resistance value information relating to the resistance value of the nonvolatile memory.

Thus, it is possible for digital ID data having excellent security to be generated at high speed and with low power consumption.

Furthermore, the ring delay circuit may be provided with an inversion circuit that inverts the output of any of the connected plurality of delay elements, and the output of any of the plurality of delay elements inverted by the inversion circuit may be connected to the input of the first-stage delay element from among the plurality of delay elements.

In addition, there may be provided: a counter memory fetch signal generation circuit that, after data retained in the counter circuit has changed due to a rising edge or a falling edge of the data that is output from any delay element from among the plurality of delay elements, generates an edge that is the inverse of the rising edge or the falling edge of the data that is output from any delay element from among the plurality of delay elements, or delays the rising edge or the falling edge of the data that is output by any delay element from among the plurality of delay elements; a third counter memory circuit that saves the data retained in the counter circuit on the basis of the time measurement end signal; and a correction circuit that refers to the data saved in the first memory circuit, the data saved in the second memory circuit, and the data saved in the third memory circuit, and corrects the data saved in the third memory circuit on the basis of predetermined determination criteria.

Furthermore, the first memory circuit may save data that is output from each of the plurality of delay elements in accordance with the time measurement start signal, and output the saved data in accordance with the time measurement end signal, the second memory circuit and the third memory circuit may output the data saved in each of the second memory circuit and the third memory circuit in accordance with the time measurement end signal, and the correction circuit may, on the basis of the data that is output from the first memory circuit, the second memory circuit, and the third memory circuit, calculate the time from the time measurement start signal being input to the time measurement end signal being input.

Furthermore, the ring delay circuit may be provided with: a change circuit that changes the voltage or current applied to the delay elements, to at least any of a power source side and a ground side of the delay elements; and an adjustment circuit for changing delay times of the delay elements.

Furthermore, the time measurement start signal and the time measurement end signal may be generated in accordance with a reference signal that is input from outside, and the adjustment circuit may change the delay times of the delay elements in such a way that the time difference from the time at which the time measurement start signal is input to the time at which the time measurement end signal is input becomes a predetermined target value.

Furthermore, an integrated circuit card according to an aspect of the present disclosure is provided with a nonvolatile memory device having the aforementioned features.

First, to aid understanding of the nonvolatile memory device and the like according to the present disclosure, the basic configuration of the nonvolatile memory device will be described.

FIG. 1 is a block diagram depicting an example of a basic configuration of a variable-resistance nonvolatile memory device 100.

As depicted in FIG. 1, the nonvolatile memory device 100 is configured of a variable-resistance nonvolatile memory cell (hereinafter, simply referred to as a "nonvolatile memory") 101 and a reading device 102. The reading device 102 is configured of a resistance-time converter 103 and a time-digital converter 104. The nonvolatile memory device 100 has at least one variable-resistance nonvolatile memory 101. The nonvolatile memory 101 stores data by determining a resistance value with at least one threshold value.

The nonvolatile memory 101 is connected to the resistance-time converter 103, and when a time measurement start signal is input to the resistance-time converter 103, a resistance value of a variable-resistance element 210 provided in the nonvolatile memory 101 is converted into time information and a time measurement end signal is output. The time-digital converter 104 counts the time between the time measurement start signal and the time measurement end signal, and outputs this as time data. That is, the resistance value of the variable-resistance element 210 provided in the nonvolatile memory 101 is output as time data, and therefore, if the value of the time data is confirmed, the resistance value of the variable-resistance element 210 provided in the nonvolatile memory 101 is consequently understood.

Figure 2:
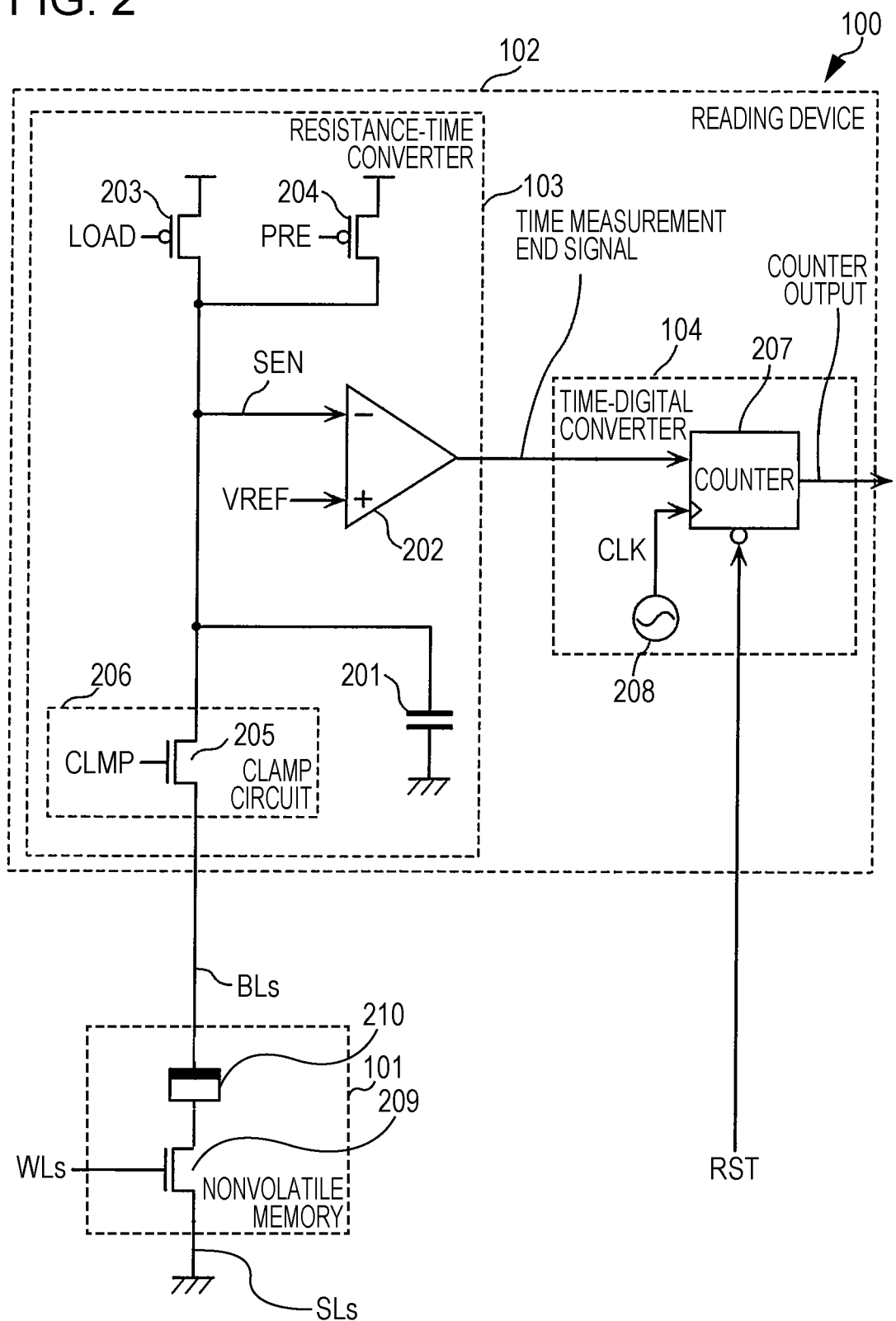
FIG. 2 is a block diagram depicting an example of a specific configuration of the nonvolatile memory device depicted in FIG. 1.

FIG. 2 is an example of a specific configuration of the nonvolatile memory device 100 depicted in FIG. 1. The reading device 102 has a discharging-type resistance-time converter 103. The resistance-time converter 103 is provided with a comparator 202, a load PMOS transistor 203, a precharge PMOS transistor 204, a clamp circuit 206 configured of a clamp NMOS transistor 205, and a charging capacitor 201.

The time-digital converter 104 is configured of a time measurement counter 207 and a VCO 208. The output of the comparator 202 is connected to the time measurement counter 207. The time measurement counter 207 starts counting by means of a clock signal CLK after a count value within the time measurement counter is initialized by RST becoming low-level.

The clock signal CLK is a signal that is output from the VCO 208, and is a signal that becomes a reference for when a discharging time that changes depending on the resistance value of the variable-resistance element 210 is converted into a count value. The clock signal CLK is a square wave that maintains a fixed frequency, for example. Each time the clock signal CLK rises, 1 is added to the count value of the time measurement counter 207, the counting up of the time measurement counter 207 stops when a node SEN falls below a VREF, and the count value at such time is maintained at COUNT_OUT. At such time, a threshold value is input to the VREF.

In the precharge PMOS transistor 204, a precharge control signal PRE is input to the gate terminal, a VDD is input to the source terminal, and the node SEN is connected to the drain terminal.

In the load PMOS transistor 203, a load control signal LOAD is input to the gate terminal, the VDD is input to the source terminal, and the node SEN is connected to the drain terminal.

In the clamp NMOS transistor 205, a clamp control signal CLMP is input to the gate terminal, and the node SEN is connected to either one of the source terminal or the drain terminal with a memory cell selected by way of a column decoder circuit being connected to the other. It should be noted that the column decoder circuit is omitted in FIG. 2.

Figure 3:
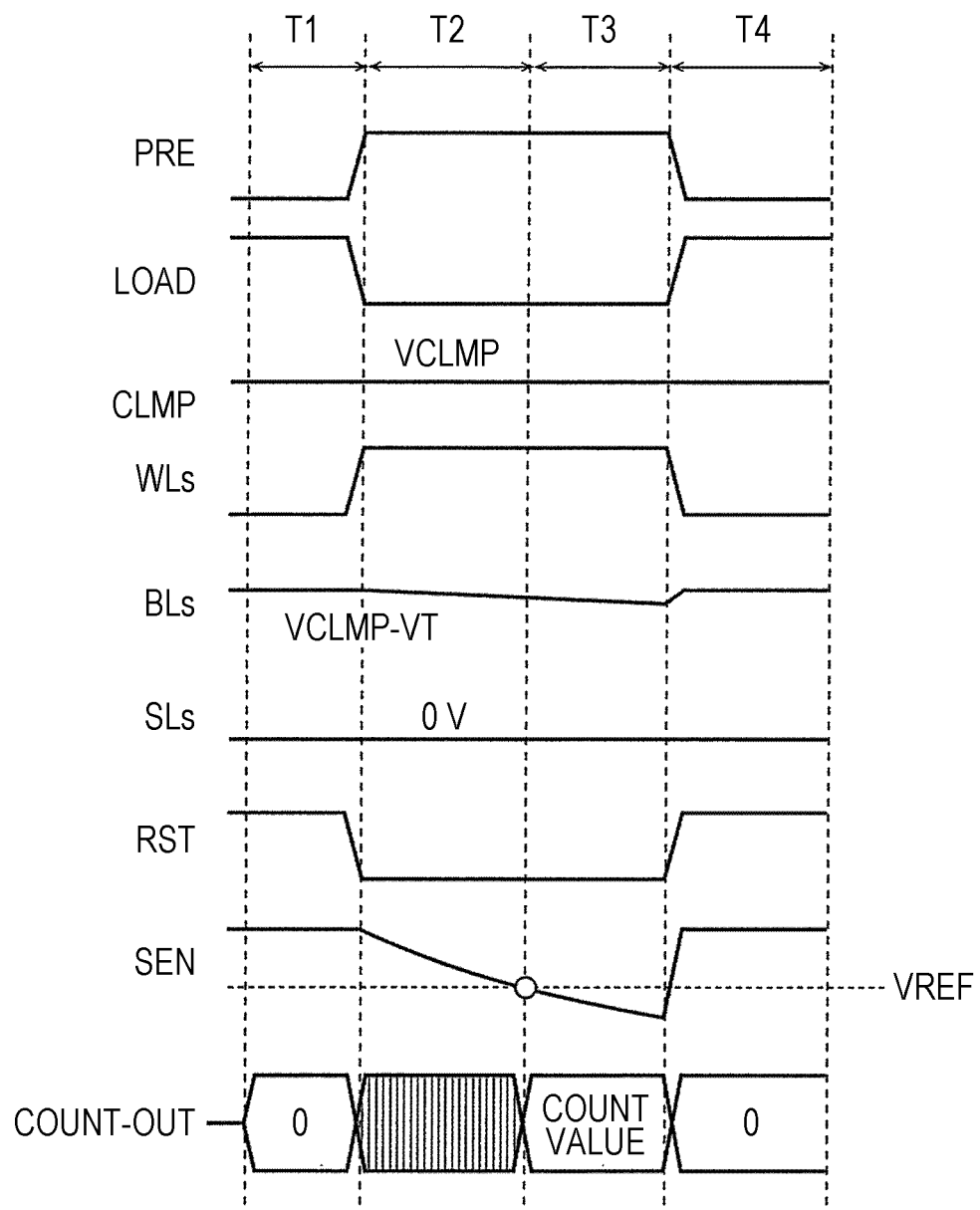
FIG. 3 is a drawing depicting an example of a timing chart for the case where a memory is read by means of a discharging method in the nonvolatile memory device.
Figure 4:
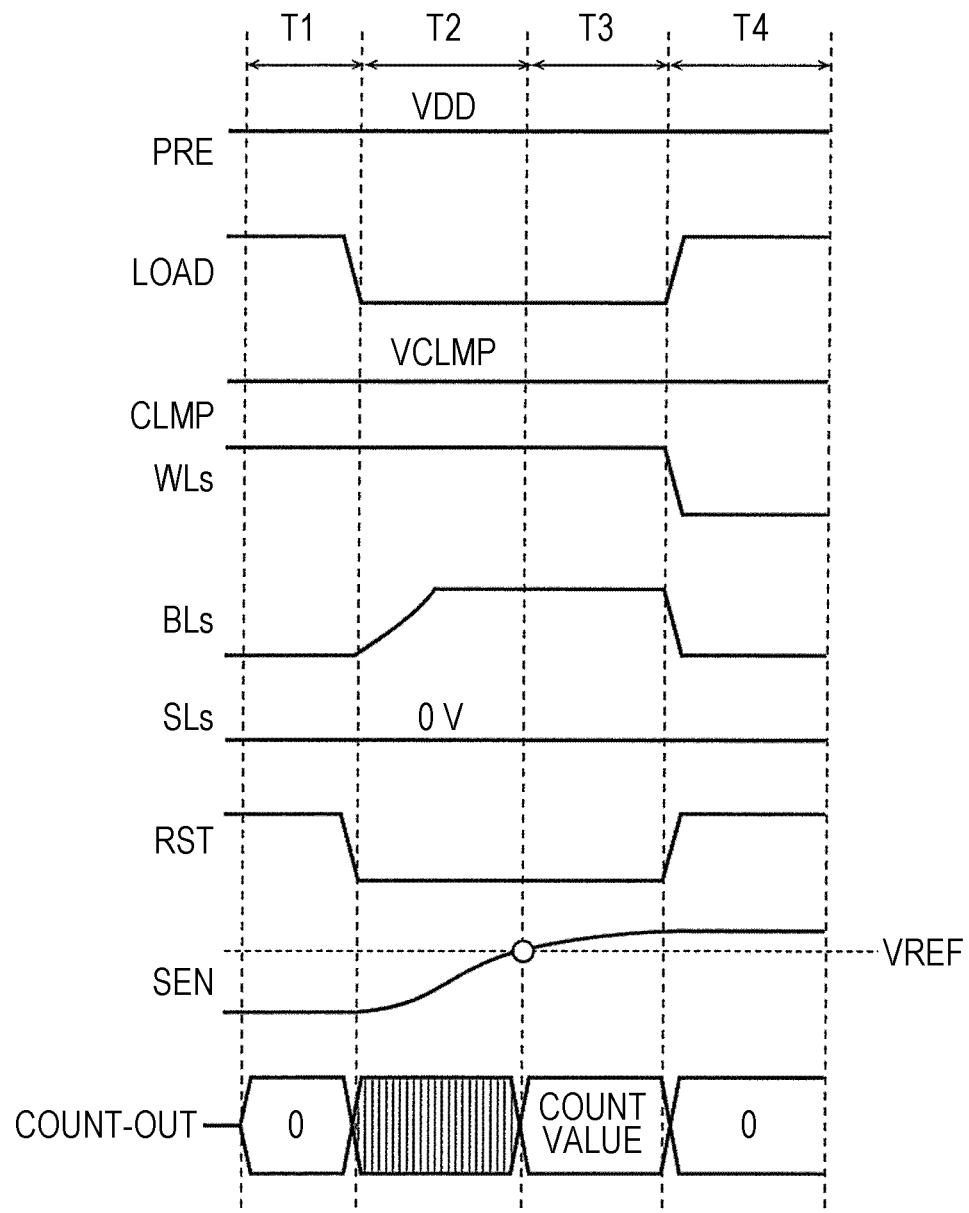
FIG. 4 is a drawing depicting an example of a timing chart for the case where a memory is read by means of a charging method in the nonvolatile memory device.

Here, an operation in which the reading device 102 outputs the count value (an example of the resistance count value) will be specifically described using FIGS. 2, 3, and 4. FIG. 3 is an example of a timing chart for the case where a memory is read by means of a discharging method in the nonvolatile memory device 100. FIG. 4 is an example of a timing chart for the case where a memory is read by means of a charging method in the nonvolatile memory device 100.

FIG. 3 is a timing chart for the case where a memory stored in the selected memory cell is read by means of a discharging method.

In the precharge period of T1, the control signal PRE becomes low-level, and the precharge PMOS transistor 204 enters an on state. Meanwhile, the control signal LOAD becomes high-level, and the load PMOS transistor 203 enters an off state. The potential of a selection word line WLs is low-level and a transistor 209 is in an off state.

Here, a VCLMP voltage is applied to the gate terminal of the clamp NMOS transistor 205 of the clamp circuit 206, and therefore the potential of a selection bit line BLs is precharged to a potential obtained by subtracting VT (threshold value for the clamp NMOS transistor 205) from VCLMP. Furthermore, a selection source line SLs is fixed to GND. The node SEN is precharged up to the VDD. Furthermore, the control signal RST for the time measurement counter connected to the output of the comparator becomes high-level. A fixed value of 0 is thereby output for the time measurement counter output terminal COUNT_OUT.

In the sensing period of T2, the control signal PRE is made high-level. Thus, the precharge PMOS transistor 204 enters an off state, and the control signal LOAD becomes low-level. Thus, the load PMOS transistor 203 enters an on state. Furthermore, the potential of the selection word line WLs is made high-level. Thus, the NMOS transistor 209 enters an on state.

A voltage is then applied from the selection bit line BLs to the selection source line SLs by way of the selected variable-resistance element 210. In other words, discharging is started. At the same time as the start of discharging, the RST of the time-digital converter 104 becomes low-level, and counting is started. Then, at each single count, the potential of the node SEN and the voltage of the reference voltage VREF are compared by the comparator 202, and the count value continues to be added until the node SEN falls below the reference voltage VREF. As the resistance value of the variable-resistance element 210 during reading increases, the discharging time increases and the count value increases.

Furthermore, it is possible to also adjust the discharging time by adjusting the capacitance of the charging capacitor 201. If the capacitance of the charging capacitor 201 increases, the discharging time of the node SEN also increases and the count value consequently increases, and if the capacitance decreases, the discharging time of the node SEN decreases and the count value decreases.

Using the charging capacitor 201 is effective when there is a desire to improve detection accuracy for a low resistance level at which the discharging time is fast, for example. The count interval is decided by the clock signal CLK, and therefore the operating frequency of the clock signal CLK serves as the resolution of the count value when the resistance value of the variable-resistance element 210 is converted as a time. However, in the case of a low resistance value, there is a possibility that the discharging time exceeds the resolution of the count value, in other words, that the discharging time is shorter than the time taken for a single count value, and may therefore become indistinguishable. Thus, by adding a capacitance load to the node SEN and causing a delay, it becomes possible to deliberately implement an adjustment to achieve discharge characteristics of a level at which detection is possible at the resolution of the count value.

However, in principle, in the case of the discharging method, as the resistance increases, the discharging time increases and accordingly the discharge amount with respect to time changes gradually, and therefore the resolution of the resistance value information with respect to the count value improves. That is, in the case of the discharging method, highly accurate information can be obtained for a resistance value on the high resistance side of the variable-resistance element 210.

In the latch period of T3, after discharging has started, the count value of the time-digital converter 104 when the node SEN has fallen below the reference voltage VREF is latched. The latched count value is output to the COUNT_OUT.

In the reset period of T4, when data output has been completed, the potential of the selection word line WLs is made low-level, the transistor 209 of the nonvolatile memory 101 selected turns off, and the read operation ends.

FIG. 4 is a timing chart for the case where a memory stored in the selected memory cell is read by means of a charging method.

In the discharge period of T1, the control signal PRE becomes high-level together with the LOAD, and both the precharge PMOS transistor 204 and the load PMOS transistor 203 enter an off state. Furthermore, the potential of the selection word line WLs is low-level and the transistor 209 is also in an off state.

Here, as a result of the VCLMP voltage being applied to the gate terminal of the clamp NMOS transistor 205 of the clamp circuit, and the potential of the selection word line WLs being made high-level, the NMOS transistor 209 enters an on state. Thus, the node SEN and the selection bit line BLs are connected to GND by way of the variable-resistance element 210, and are discharged to a GND level. Furthermore, the control signal RST for the time measurement counter connected to the output of the comparator becomes high-level. A fixed value of 0 is thereby output for the time measurement counter output terminal COUNT_OUT.

In the sensing period of T2, the control signal LOAD becomes low-level, and the load PMOS transistor 203 therefore enters an on state. Thus, a current path of the load PMOS transistor 203, the clamp NMOS transistor 205, and the selected nonvolatile memory 101 is formed, and charging is started to the node SEN and the selection bit line BLs. At the same time as charging is started, the control signal RST of the time-digital converter 104 becomes low-level, and counting is started. Then, at each single count, the potential of the node SEN and the voltage of the reference voltage VREF are compared by the comparator 202, and the count value continues to be added until the node SEN exceeds the reference voltage VREF. As the resistance value of the variable-resistance element 210 during reading decreases, the charging time increases and the count value increases.

Furthermore, using the charging capacitor 201, it is possible to adjust the charging time in the charging method in the same manner as when adjusting the discharging time in the discharging method. A detailed explanation thereof is the same as the explanation for the discharging method, and is therefore omitted.

In principle, in the case of the charging method, as the resistance decreases, the charging time increases and accordingly the charge amount with respect to time changes gradually, and therefore the resolution of the resistance value information with respect to the count value improves. That is, in the case of the charging method, highly accurate information can be obtained for a resistance value on the low resistance side of the variable-resistance element 210.

In the latch period of T3, after charging has started, the count value of the time-digital converter 104 when the node SEN has exceeded the reference voltage VREF is held. The held count value is output to the COUNT_OUT, and is treated as a count value that expresses the resistance value information of the variable-resistance element 210.

In the reset period of T4, when data output has been completed, the potential of the selection word line WLs is made low-level, the transistor 209 of the nonvolatile memory 101 selected turns off, and the read operation ends.

In this way, the resolution with respect to the resistance value information differs depending on the reading method, and therefore, in the case where there is a desire to obtain resistance value information in a highly accurate manner, it is desirable to use the discharging method when digital ID data is saved using a high resistance value range, and, conversely, it is desirable to use the charging method when digital ID data is saved using a low resistance value range.

However, meanwhile, the counter range of the time-digital converter 104 depicted in FIG. 2 is a finite amount due to hardware constraints. That is, when the discharging time or charging time such as the aforementioned is too long, the range of the counter is exceeded, and there is a problem in that accurate resistance value information is not obtained.

Therefore, in the case where a reduction in circuit scale is to be achieved with the necessary counter bit width being reduced, it is desirable for the discharging method to be used when digital ID data is saved using a low resistance value range, and, conversely, it is desirable for the charging method to be used when digital ID data is saved using a high resistance value range.

Embodiment 1

Hereinafter, a nonvolatile memory device according to embodiment 1 will be described using FIGS. 5 to 10.

Figure 5:
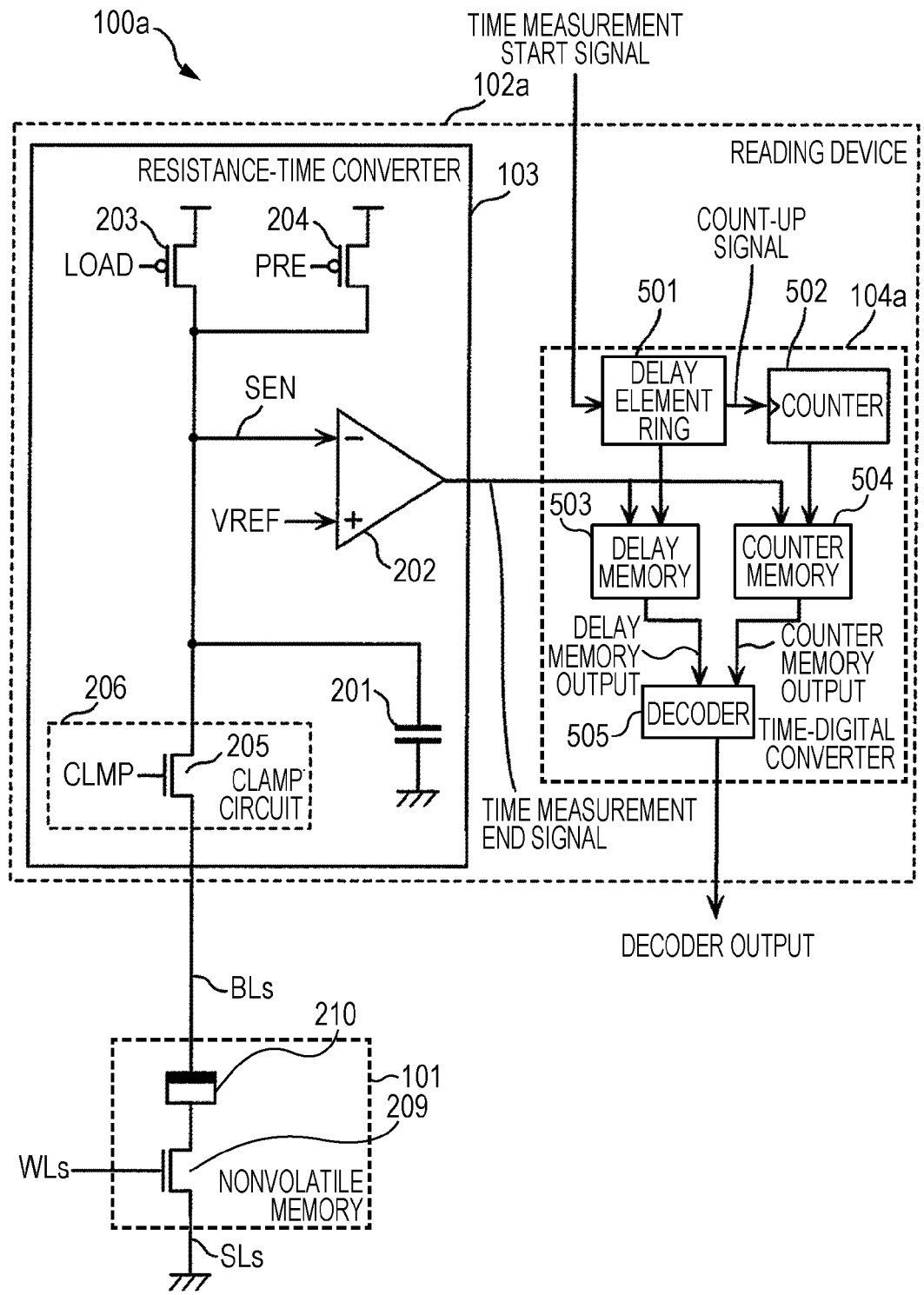
FIG. 5 is a block diagram depicting an example of a detailed configuration of a nonvolatile memory device according to embodiment 1.
Figure 6:
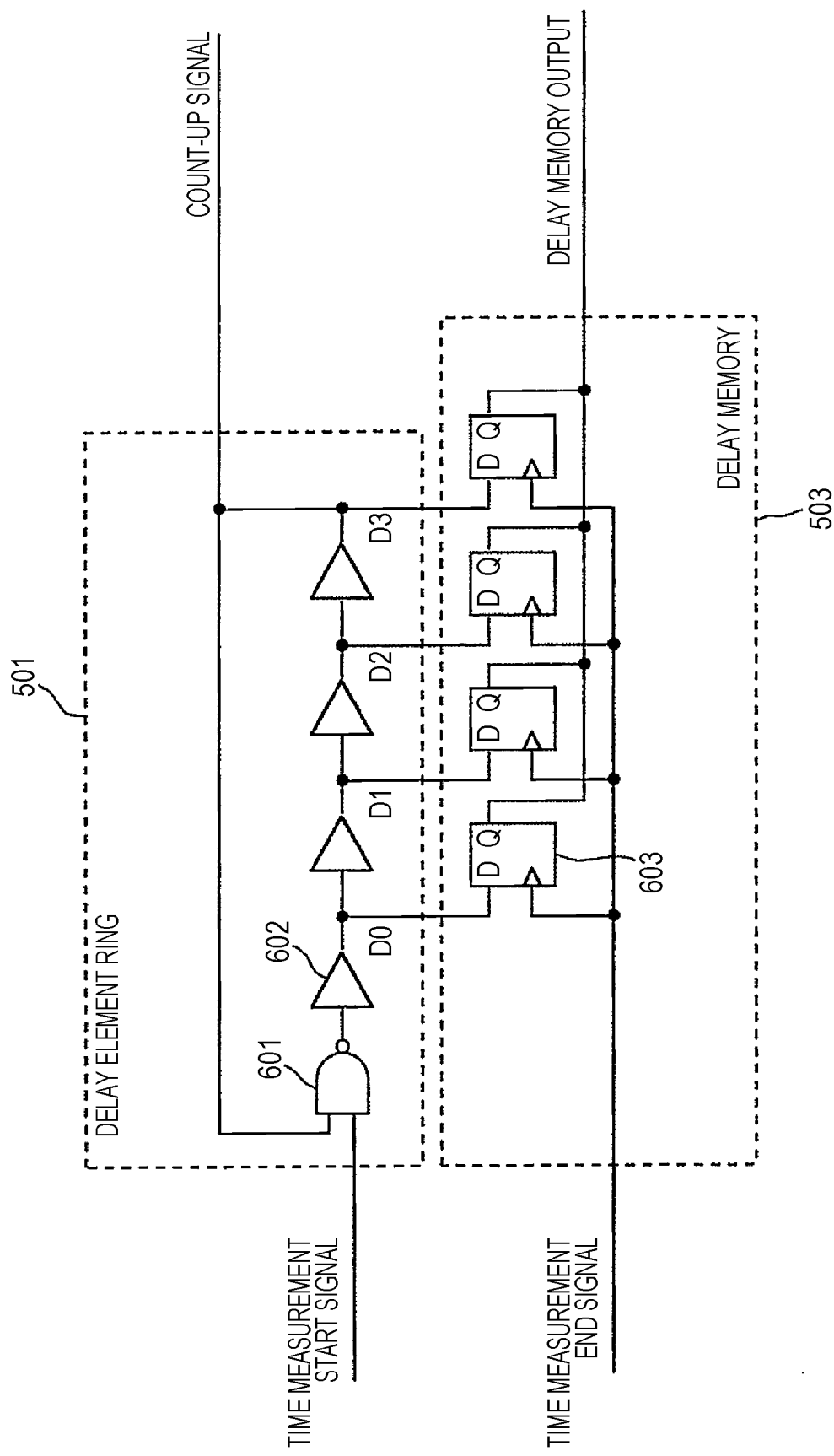
FIG. 6 is a block diagram depicting an example of a detailed configuration of a delay element ring and a delay memory according to embodiment 1.

To begin, a configuration of the nonvolatile memory device according to the present embodiment will be described. FIG. 5 is a block diagram depicting a configuration of the nonvolatile memory device according to the present embodiment. FIG. 6 is a block diagram depicting an example of a detailed configuration of a delay element ring 501 and a delay memory 503 according to the present embodiment.

As depicted in FIG. 5, a nonvolatile memory device 100a according to the present embodiment is provided with the variable-resistance nonvolatile memory 101 and a reading device 102a.

The reading device 102a has the resistance-time converter 103 and a time-digital converter 104a. The variable-resistance nonvolatile memory 101 and the resistance-time converter 103 have the same configurations as those of the variable-resistance nonvolatile memory 101 and resistance-time converter 103 depicted in FIG. 2. Furthermore, the time-digital converter 104a has a different internal configuration from that of the time-digital converter 104 depicted in FIG. 2.

The time-digital converter 104a is configured of: the delay element ring 501; the delay memory 503, which saves the phase state (retained data, specifically A to H described in detail later on) of the delay element ring 501; a counter 502; a counter memory 504 that records the state (retained data, specifically a count value) of the counter 502; and a decoder 505 that decodes output of the delay memory 503 and the counter memory 504. Here, the phase state of the delay element ring 501 refers to data retained by the delay element ring 501, specifically output data A to H described in detail later on. Furthermore, the state of the counter 502 refers to data retained by the counter 502, specifically a count value described in detail later on.

As depicted in FIG. 6, the delay element ring 501 is configured of delay elements 602 in which the input and output have the same logic, represented by buffers or the like, and a NAND element 601, for example. In the delay element ring 501, the plurality of delay elements 602 are linked in series, and any of the delay elements from among said plurality of delay elements 602 is connected to the NAND element 601 that constitutes input. For example, the final-stage delay element 602 is connected to the input NAND element 601 that constitutes input. It should be noted that FIG. 6 depicts the delay element ring 501 having the delay elements 602 linked in four stages as an example. Furthermore, the output data corresponding to each delay element 602 is also referred to as bits. It should be noted that the output data corresponding to the counter 502 described later on is also referred to as bits.

Furthermore, the delay memory 503 is configured of a plurality of delay flip-flops 603 linked in series. FIG. 6 depicts the delay memory 503 having the delay flip-flops 603 linked in four stages as an example. The delay flip-flops 603 are respectively connected to the outputs of the four-stage delay elements 602.

It should be noted that the resistance-time converter 103 and the time-digital converter 104a are respectively examples of a first conversion circuit and a second conversion circuit in the present disclosure. Furthermore, the delay element ring 501 is an example of a ring delay circuit in the present disclosure. The counter 502 is an example of a counter circuit in the present disclosure. The delay memory 503 and the counter memory 504 are respectively examples of a first memory circuit and a second memory circuit in the present disclosure. Furthermore, the NAND element 601 is an example of an inversion circuit in the present disclosure.

Figure 7:
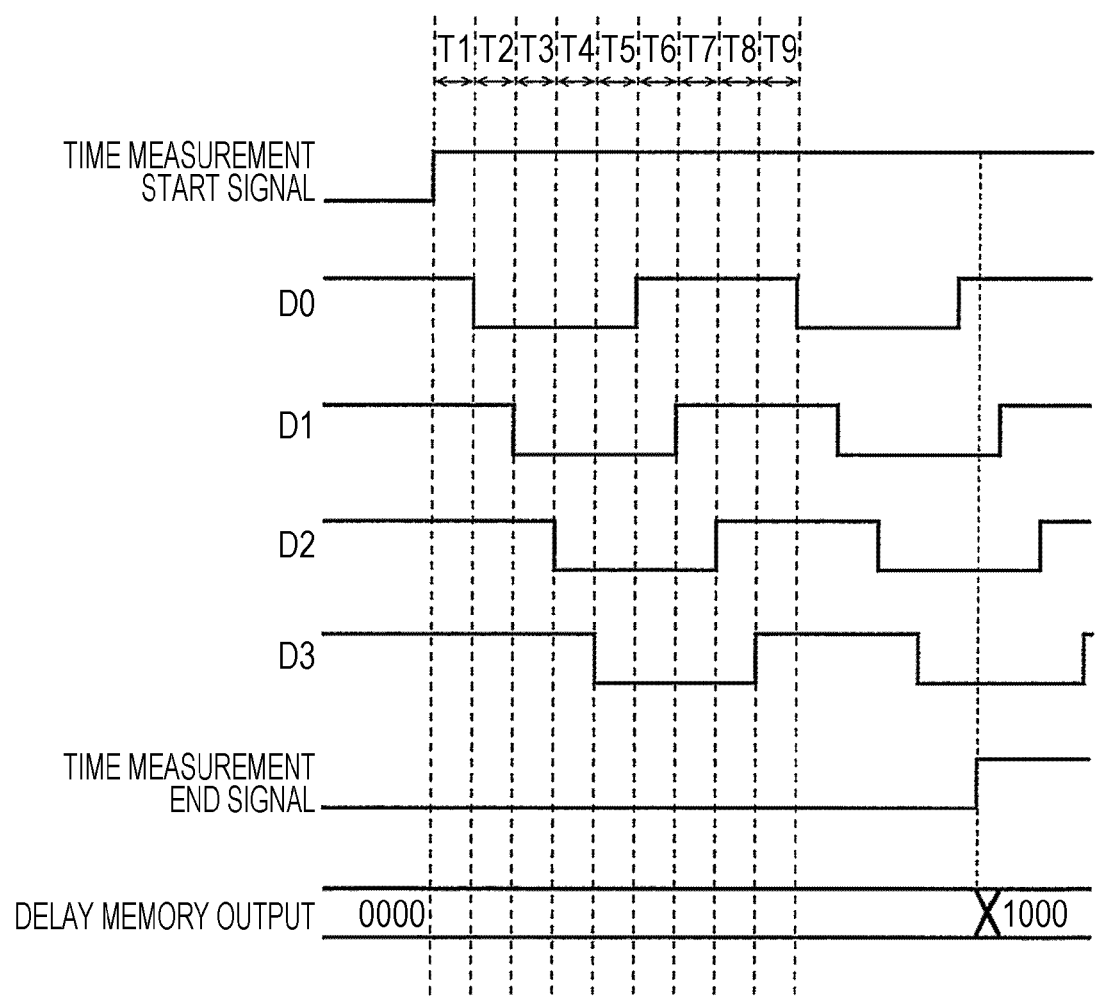
FIG. 7 is a drawing depicting an example of a timing chart depicting operations of the delay element ring and the delay memory depicted in FIG. 6.

Next, operations of the nonvolatile memory device 100a in the present embodiment will be described. FIG. 7 is a timing chart depicting operations of the delay element ring 501 and the delay memory 503 depicted in FIG. 6.

It should be noted that, hereinafter, a "rising edge" refers to a boundary where an output signal changes from low to high, in other words, a boundary where output data changes from 0 to 1. Furthermore, a "falling edge" refers to a boundary where an output signal changes from high to low, in other words, a boundary where output data changes from 1 to 0.

As depicted in FIG. 7, when a time measurement start signal is input in the delay element ring 501, falling edges are transmitted in the order of from the first-stage delay element 602 to the second, third, and fourth-stage delay elements 602. If the data that is output from each of the delay elements 602 from the first stage to fourth stage is taken as D0, D1, D2, and D3, the data that is output from each of the delay elements 602 in the intervals of T1→T2→T3→T4→T5 depicted in FIG. 7 changes in the order of (D0, D1, D2, D3)=(1, 1, 1, 1)→(0, 1, 1, 1)→(0, 0, 1, 1)→(0, 0, 0, 1)→(0, 0, 0, 0). The falling edge transmitted to the fourth-stage delay element 602 is transmitted to the NAND element 601 of the delay element ring 501, and is converted into a rising edge at the NAND.

Following on, rising edges are transmitted from the first-stage delay element 602 to the second, third, and fourth-stage delay elements 602, and the data that is output from each of the delay elements 602 in the intervals of T5→T6→T7→T8→T9 changes in the order of (D0, D1, D2, D3)=(0, 0, 0, 0)→(1, 0, 0, 0)→(1, 1, 0, 0)→(1, 1, 1, 0)→(1, 1, 1, 1). The rising edge transmitted to the fourth-stage delay element 602 is transmitted to the NAND element 601 of the delay element ring 501, and is converted into a falling edge at the NAND. Hereinafter, the same operation as that which is first carried out is repeated.

As mentioned above, the output data (D0, D1, D2, D3) of the delay elements 602 expressed by four bits does not result in a simple increase of a binary number. Thus, if it is assumed that (1, 1, 1, 1)=A, (0, 1, 1, 1)=B, (0, 0, 1, 1)=C, (0, 0, 0, 1)=D, (0, 0, 0, 0)=E, (1, 0, 0, 0)=F, (1, 1, 0, 0)=G, and (1, 1, 1, 0)=H, the delay element ring 501 performs the operation of a three-bit counter that repeats the output of eight types of data from A to H.

As mentioned above, in the delay element ring 501, when the time measurement start signal is input, rising edges and falling edges are alternately transmitted in the order of from the first-stage delay element 602 to the second, third, and fourth-stage delay elements 602. A delay flip-flop 603 is connected to the output side of each of the delay elements 602. When a time measurement end signal is input to the delay memory 503, output data (1 or 0) from the delay elements 602 is saved in the delay flip-flops 603. By referring to the output data saved in the delay memory 503, it is possible to determine the time from the time measurement start signal being input to the time measurement end signal being input. For example, in the case where the delay amount per one delay element 602 is 100 picoseconds and (D0, D1, D2, D3)=(0, 0, 0, 1), it is understood that the time from the time measurement start signal being input to the time measurement end signal being input is 300 picoseconds.

However, until the time measurement end signal is input to the delay memory 503, the rising edges and falling edges continue within the delay element ring 501 in an alternating manner indefinitely. Consequently, it is difficult to determine how many times a rising edge and a falling edge has occurred up to the time measurement end signal being input to the delay memory 503. Thus, as depicted in FIG. 5, the output of the final-stage delay element 602 of the delay element ring 501 is connected to the input of the counter 502 as a count-up signal.

Figure 8:
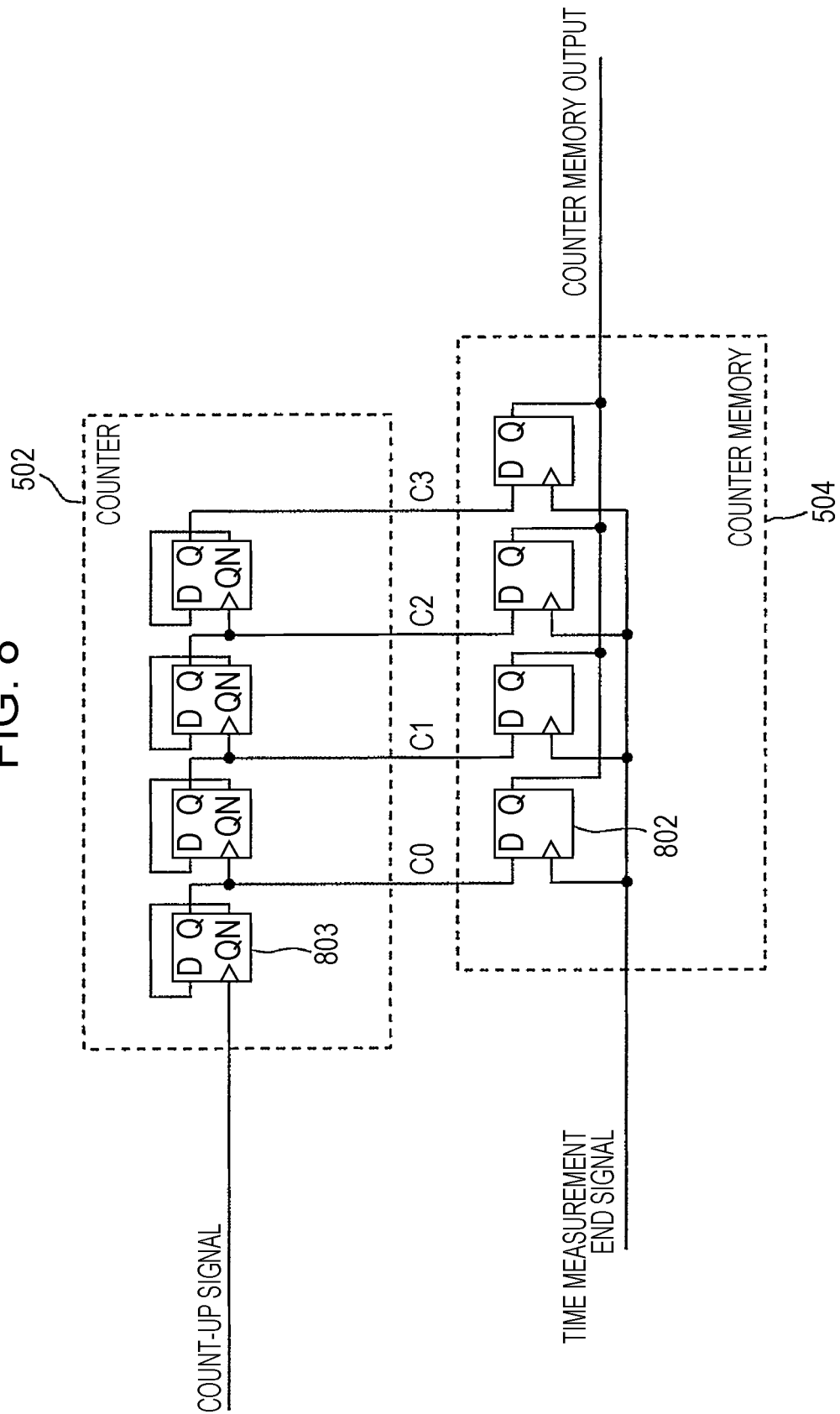
FIG. 8 is a block diagram depicting an example of a detailed configuration of a counter and a counter memory according to embodiment 1.
Figure 9:
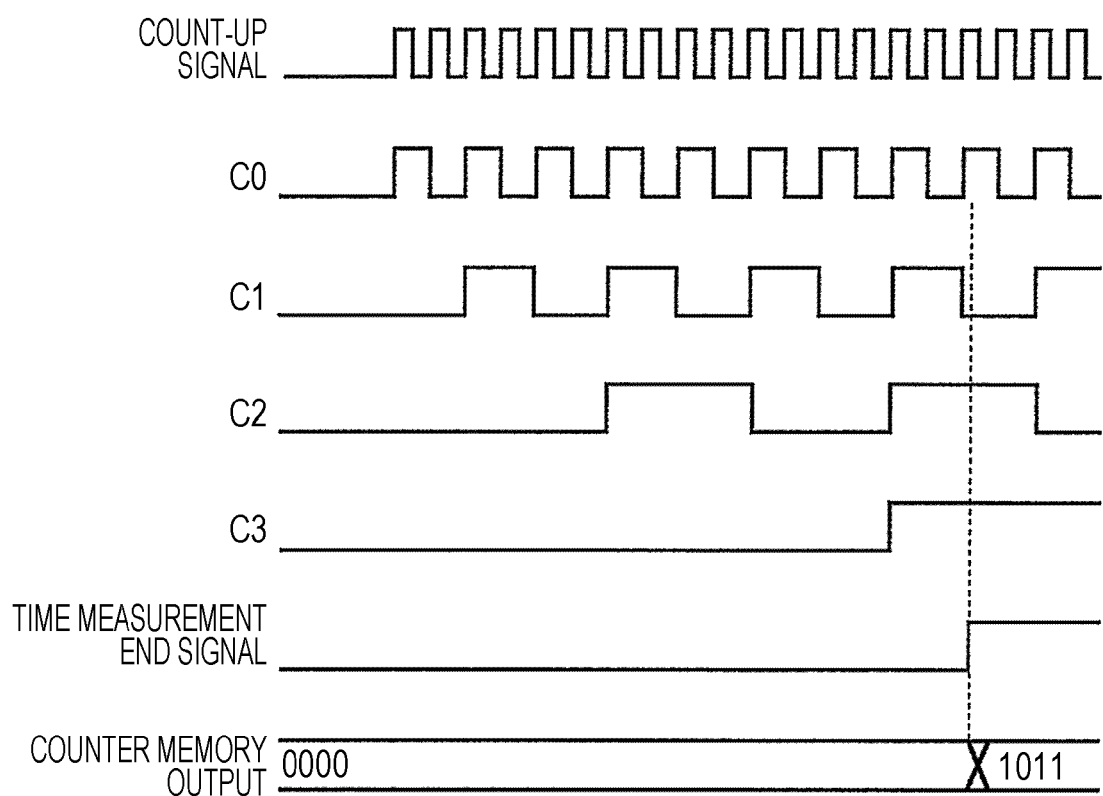
FIG. 9 is a drawing depicting an example of a timing chart depicting operations of the counter and the counter memory according to embodiment 1.

FIG. 8 is a block diagram depicting an example of a detailed configuration of the counter 502 and the counter memory 504 according to the present embodiment. FIG. 9 is an example of a timing chart depicting operations of the counter 502 and the counter memory 504 according to the present embodiment.

The counter 502 is configured of a plurality of flip-flops 803 linked in series. FIG. 8 depicts the counter 502 having the flip-flops 803 linked in four stages as an example.

The counter memory 504 is configured of a plurality of counter flip-flops 802 linked in series. FIG. 8 depicts the counter memory 504 having the counter flip-flops 802 linked in four stages as an example. The counter flip-flops 802 are respectively connected to the outputs of the four-stage flip-flops 803.

For the counter 502, a synchronous counter may be used rather than the asynchronous counter depicted in FIG. 8. The counter 502 adds 1 to a count value each time a count-up signal is input. That is, 1 is added to the count value each time the output D3 of the final-stage delay element 602 of the delay element ring 501 changes from low to high.

Specifically, the outputs (C0, C1, C2, C3) of the flip-flops 803 increase by 1 at a time as in (0, 0, 0, 0), (1, 0, 0, 0), (0, 1, 0, 0), and (1, 1, 0, 0). The outputs of the flip-flops 803 are connected to the counter memory 504. When a time measurement end signal is input to the counter flip-flops 802, count values are stored in the counter flip-flops 802. By referring to the count values stored in the counter memory 504, the delay element ring 501 can determine how many times a rising edge or falling edge has occurred in the delay element ring 501.

In addition, the aforementioned values acquired by the delay memory 503 and the count values acquired by the counter memory 504 are decoded by the decoder 505 and summed up, and it is thereby possible to determine how many stages of delay elements are equivalent to the time that has elapsed. If the delay amount per one delay buffer stage is several picoseconds to several nanoseconds, and a conventional method in which time is measured by a counter is adopted, a resolution is consequently obtained that is the same as that obtained when a counter is operating at several hundred megahertz to several hundred gigahertz.

For example, in the case where the delay element ring 501 and delay memory 503 depicted in FIG. 6 and the counter 502 and counter memory 504 depicted in FIG. 8 are combined, when the delay elements 602 in the delay element ring 501 constitute four stages and the flip-flops 803 in the counter 502 are configured of four bits, consequently the delay buffers can constitute eight stages and the counter can perform 16 counts, and measurement can be performed with 8×16=128 stages in total.

Figure 10:
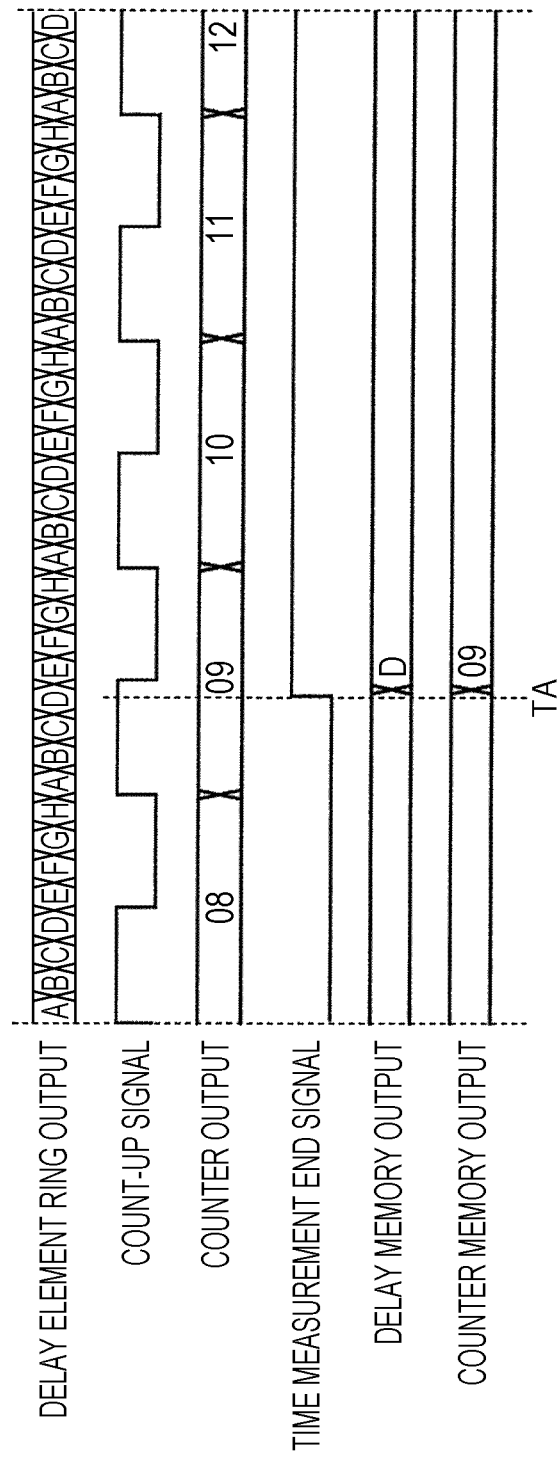
FIG. 10 is a drawing depicting an example of a timing chart depicting operations of the delay element ring, the delay memory, the counter, and the counter memory according to embodiment 1.

FIG. 10 is an example of a timing chart depicting operations of the delay element ring 501, the delay memory 503, the counter 502, and the counter memory 504 according to the present embodiment.

When the time measurement end signal is input, the output of the delay element ring 501 is stored in the delay memory 503, and the output of the counter 502 is stored in the counter memory 504. For example, in the case where the time measurement end signal is input at the timing of time TA indicated in the timing chart depicted in FIG. 10, D is stored in the delay memory 503, and 9 is stored in the counter memory 504 as a decimal number. D that is output from the delay memory 503 corresponds to three of the delay elements 602.

In addition, the decoder 505 calculates and outputs how many of the delay elements 602 are equivalent to the delay time, namely the time from the time measurement start to the time measurement end, on the basis of the output of the delay memory 503 and the output of the counter memory 504. In the case where the delay element ring 501 and delay memory 503 depicted in FIG. 6 and the counter 502 and counter memory 504 depicted in FIG. 8 are combined, a count value of 1 of the counter 502 corresponds to eight of the delay elements 602, and therefore there are 3+8×9=75 stages when expressing the number of stages of all of the delay elements 602. In addition, when the processing time of the delay elements 602 is taken as having been 100 picoseconds per one stage, it is understood that the time from the time measurement start to the time measurement end was 7.5 nanoseconds. From a time obtained in this manner, it is possible to acquire the resistance value (resistance value information) of the variable-resistance element 210 provided in the nonvolatile memory 101.

The delay element ring in FIG. 6 is configured of the NAND element 601, the delay elements 602, and the delay flip-flops 603; however, it should be noted that an AND element may be used instead of the NAND element 601. Furthermore, the delay element ring may be configured of only the delay elements 602 and the delay flip-flops 603 without using the NAND element 601. In these cases, a mechanism with which the outputs of the delay elements 602 are returned to the original state may be newly provided.

Hereinabove, according to a nonvolatile memory device according to an aspect of the present disclosure, the time-digital converter 104 is configured using the delay element ring 501, the counter 502, the delay memory 503, the counter memory 504, and the decoder 505, and it is thereby possible to obtain a high temporal resolution without increasing the counter operating speed. Since the counter operating speed is not increased, it is possible to suppress an increase in power consumption.

Figure 24:
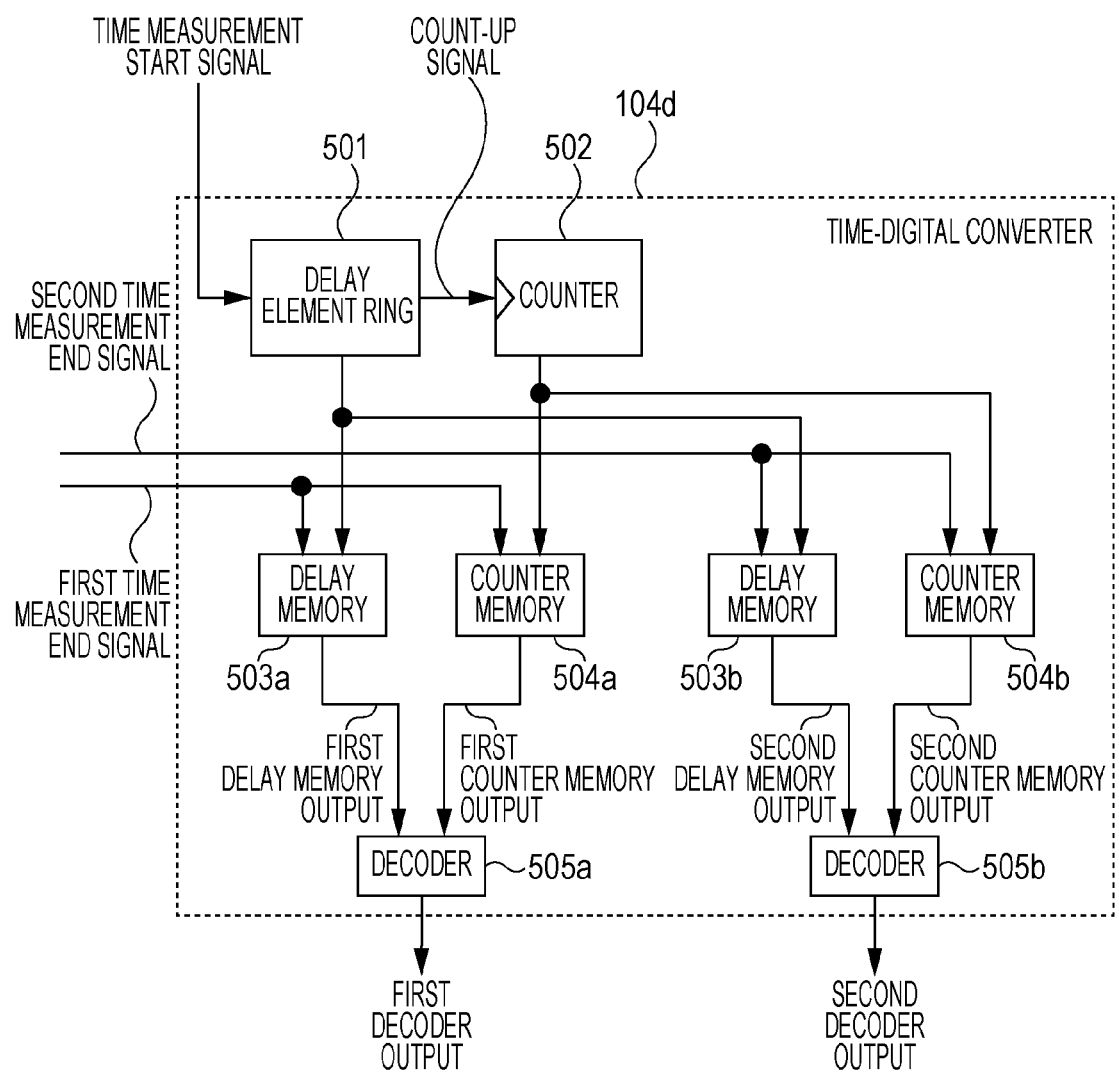
FIG. 24 is a block diagram depicting a time-digital converter according to a modified example of embodiment 1.

FIG. 24 depicts a time-digital converter 104d according to a modified example of embodiment 1.

The time-digital converter 104d includes the delay element ring 501, the counter 502, delay memories 503a and 503b, counter memories 504a and 504b, and decoders 505a and 505b. The delay memory 503a, the counter memory 504a, and the decoder 505a constitute a first channel, and the delay memory 503b, the counter memory 504b, and the decoder 505b constitute a second channel.

The configurations of the delay memories 503a and 503b are the same as that of the aforementioned delay memory 503, for example. The configurations of the counter memories 504a and 504b are the same as that of the aforementioned counter memory 504, for example. The configurations of the decoders 505a and 505b is the same as that of the aforementioned decoder 505, for example.

The operations in the channels of the time-digital converter 104d are the same as those described above as the operations of the delay memory 503, the counter memory 504, and the decoder 505, for example.

The time-digital converter 104d, for example, receives a time measurement start signal from outside, receives a first time measurement end signal from a first resistance-time converter (not depicted), and receives a second time measurement end signal from a second resistance-time converter (not depicted). Each of these resistance-time converters has the same configuration as that of the aforementioned resistance-time converter 103, for example. A resistance value of a first nonvolatile memory (not depicted), for example, is reflected in the first time measurement end signal, and a resistance value of a second nonvolatile memory (not depicted), for example, is reflected in the second time measurement end signal.

The first channel outputs information regarding the time from the time measurement start time to the first time measurement end time as first decoder output. The second channel outputs information regarding the time from the time measurement start time to the second time measurement end time as second decoder output. The time-digital converter 104d is thereby able to output a plurality of items of time information in parallel on the basis of different time measurement end signals. Therefore, for example, a reading device that includes the time-digital converter 104d and a plurality of resistance-time converters is able to acquire information regarding the resistance values of a plurality of nonvolatile memories in parallel.

It should be noted that the time-digital converter 104d may be provided with three or more channels. The time-digital converter 104d would thereby able to acquire three or more items of time information. In the time-digital converter 104d, a decoder does not have to be provided for each channel, and a decoder may be shared by a plurality of channels. In this case, for example, the decoder selectively acquires one set of delay memory output and counter memory output from a plurality of channels, and generates one item of decoder output on the basis thereof. Thus, a plurality of items of decoder output can be output from one decoder.

Based on the above, with the nonvolatile memory device 100a according to the present embodiment, it is possible for digital ID data having excellent security to be generated at high speed and with low power consumption.

Embodiment 2

Figure 11:
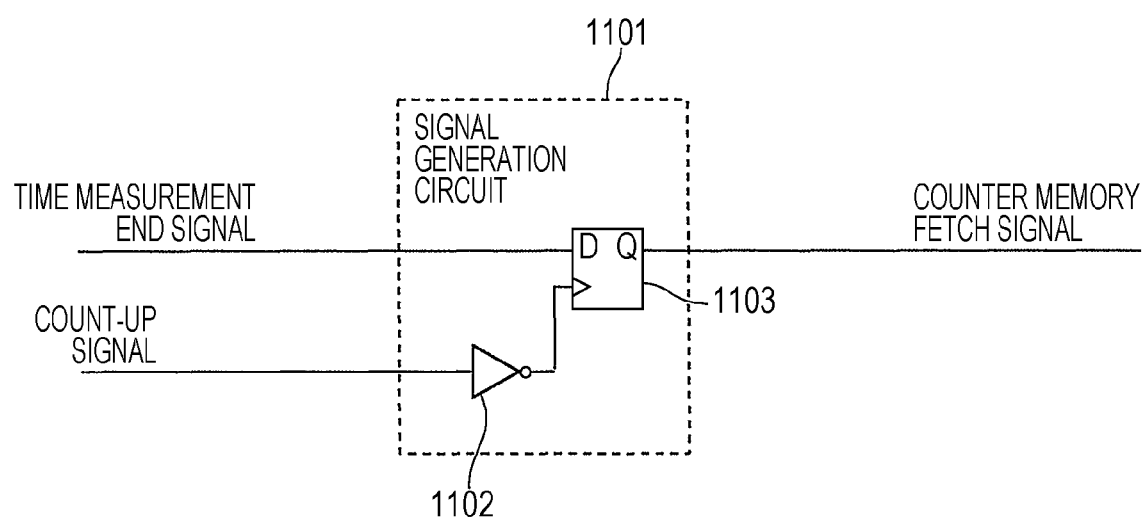
FIG. 11 is a block diagram depicting an example of a counter memory fetch signal generation circuit according to embodiment 2.
Figure 12:
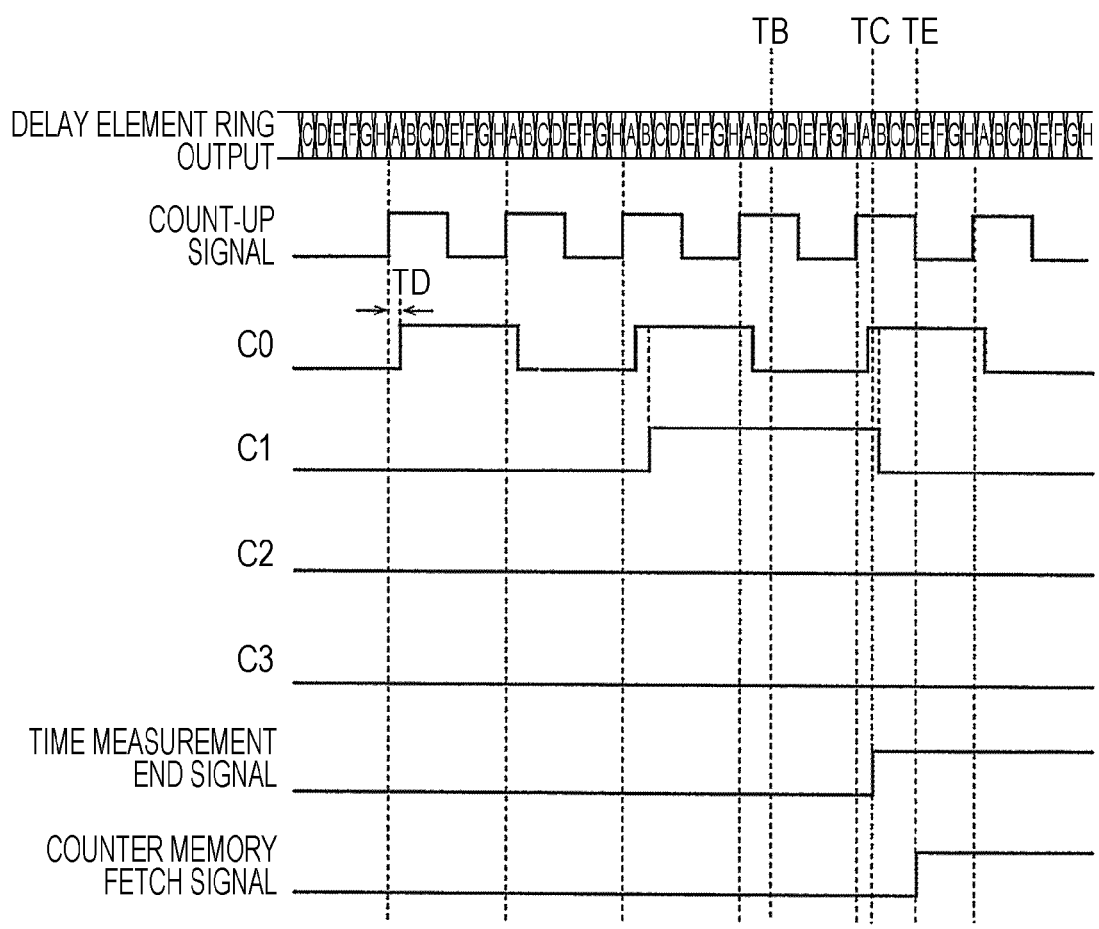
FIG. 12 is a drawing depicting an example of a timing chart depicting operations of the counter memory fetch signal generation circuit in the case where there is a delay in a delay element ring and a counter according to embodiment 2.
Figure 13:
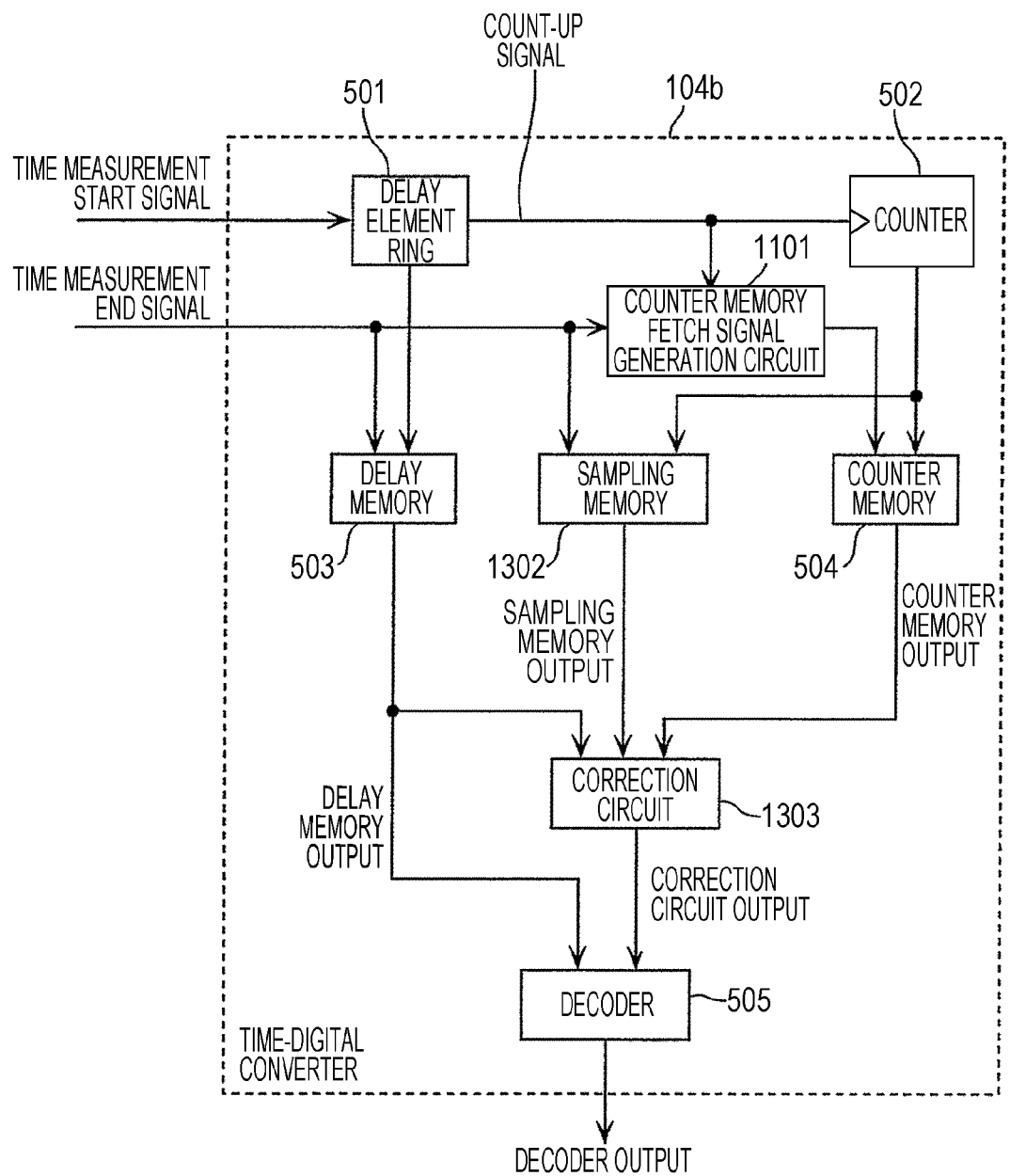
FIG. 13 is a block diagram depicting an example of a time-digital converter that includes the counter memory fetch signal generation circuit, a sampling memory, and a correction circuit according to embodiment 2.
Figure 14:
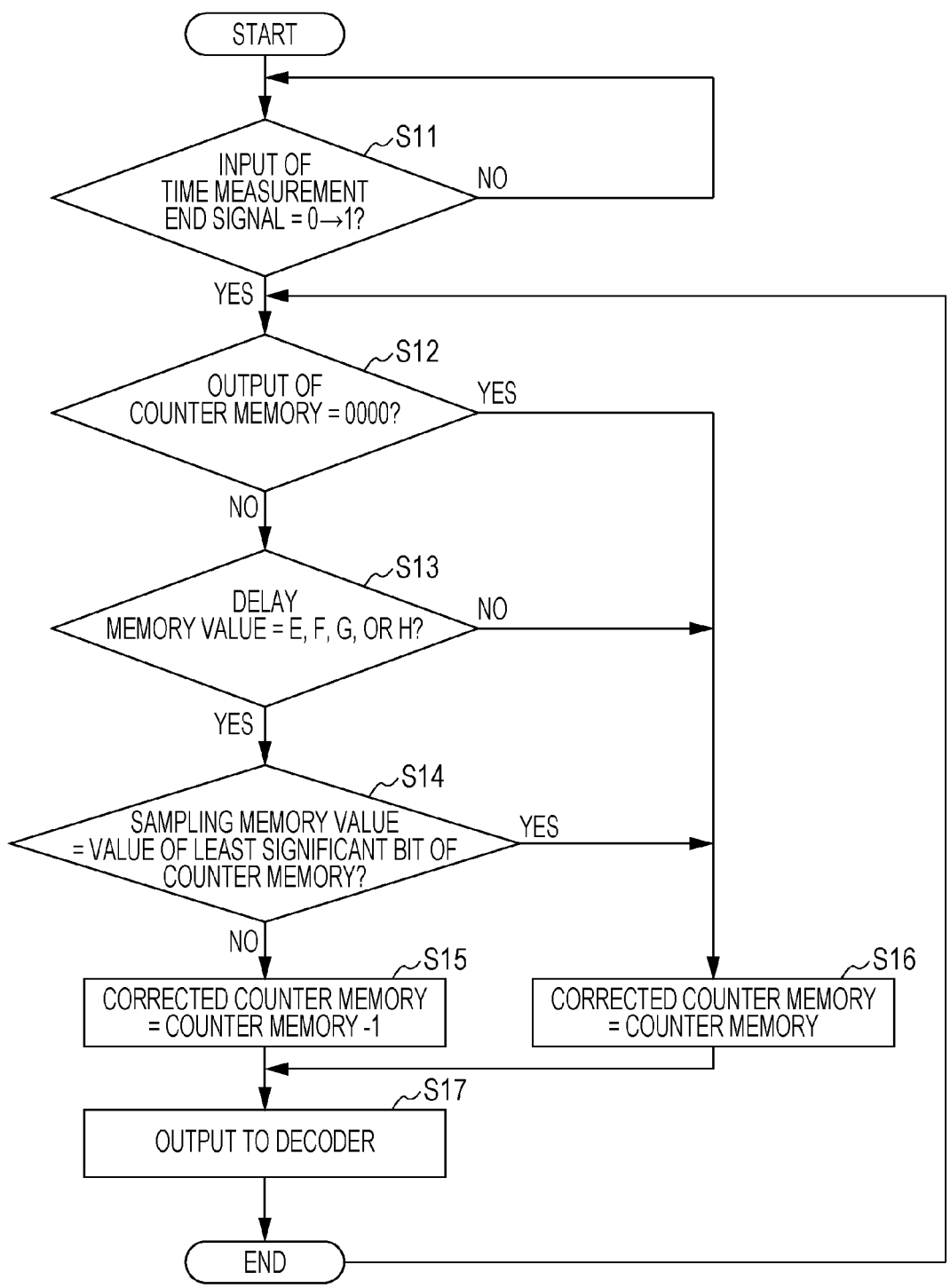
FIG. 14 is a flowchart depicting a specific example of a processing flow in which the correction circuit corrects a count value according to embodiment 2.

Next, a nonvolatile memory device according to the present embodiment will be described using FIGS. 11 to 18. FIG. 11 is a block diagram depicting an example of a counter memory fetch signal generation circuit according to the present embodiment. FIG. 12 is an example of a timing chart depicting operations of the counter memory fetch signal generation circuit in the case where there is a delay in a delay element ring and a counter according to the present embodiment. FIG. 13 is a block diagram depicting an example of a time-digital converter that includes the counter memory fetch signal generation circuit, a sampling memory, and a correction circuit according to the present embodiment. FIG. 14 is a flowchart depicting a specific example of a processing flow in which the correction circuit corrects a count value according to the present embodiment.

In practice, when there is an operation delay in the delay elements 602, there are cases where the nonvolatile memory device 100a does not operate as envisaged. In particular, in the case of the asynchronous counter 502 such as that depicted in FIG. 8, the extent to which the circuit delay effect of the flip-flops 803 accumulates increases with higher-order bits (output from the later stages from among the plurality of flip-flops 803), and the bits do not change at the same time. If the counter 502 were configured of a synchronous counter, the delay of the flip-flops 803 would not accumulate, however, variations produced during manufacture, parasitic resistance, parasitic capacitance, and the like would accompany the output elements of each bit, and the bits would not change at the same time.

For example, as depicted in FIG. 12 described later on, the bit outputs C1, C2, C3, and C4 of the counter 502 do not operate at the same timing as a count-up signal, and are output delayed with respect to the count-up signal. At the timing of time TB, the change of each bit of the counter 502 has completed, and therefore a normal value is acquired by the counter memory 504 even if a time measurement end signal is input. However, when a time measurement end signal is input at the timing of time TC, the change (for example, bit output C1) of each bit of the counter 502 has not completed, and therefore an erroneous value is saved in the counter memory 504.

Furthermore, deviation in the operation timings of the delay element ring 501 and the counter 502 become a problem. For example, as depicted in FIG. 12, the count-up signal rises at the timing when the output from the delay element ring 501 switches from 7 to 0, and 1 is added to the value of the counter 502. However, in practice, C0, which is the $0^{th}$ bit of the counter 502, changes after the elapse of the delay time of the time TD from the rise of the count-up signal. This causes an erroneous value to be input to the counter memory 504 even if a time measurement end signal is input in the period of time TD.

In order to prevent this kind of problem, in the nonvolatile memory device according to the present embodiment, a counter memory fetch signal generation circuit (in FIG. 11, simply depicted as a "signal generation circuit") 1101 such as that depicted in FIG. 11 is provided.

The counter memory fetch signal generation circuit 1101 is a circuit that delays the time measurement end signal. In detail, after data retained in the counter circuit has changed due to a rising edge or a falling edge of data that is output from any of the plurality of delay elements 602, the counter memory fetch signal generation circuit 1101 generates an edge that is the inverse of the rising edge or the falling edge of the data that is output from any of the plurality of delay elements 602. Alternatively, the counter memory fetch signal generation circuit 1101 delays the rising edge or the falling edge that is output from any of the plurality of delay elements 602.

As depicted in FIG. 11, the counter memory fetch signal generation circuit 1101 is configured of an inversion element 1102 and a flip-flop circuit 1103. The counter memory fetch signal generation circuit 1101, when installed in a time-digital converter 104b as depicted in FIG. 13, performs an operation in which the time measurement end signal is resampled when the count-up signal is inverted.

Specifically, as depicted in the timing chart of FIG. 12, after the time measurement end signal has been input at the time TC, the counter memory fetch signal generation circuit 1101 generates a counter memory fetch signal at the falling edge (time TE) of the first count-up signal. The counter 502 adds 1 to the count value at the rising edge of the count-up signal.

When the time measurement end signal has been input, the counter memory 504 saves the count value by means of the subsequent counter memory fetch signal. If the time taken for each bit output of the counter 502 to stabilize is shorter than a half period of the count-up signal, consequently the count value is always saved in the counter memory 504 after each bit output by the counter 502 has completed operating. Thus, it is possible to prevent an erroneous operation caused by operation variations of each bit of the counter output.

It should be noted that the aforementioned counter memory fetch signal generation circuit 1101 does not have to be configured of the inversion element 1102 and the flip-flop circuit 1103, for example, as long as the operation of the counter 502 and the timing of the counter memory 504 are offset. Instead of the counter memory fetch signal generation circuit 1101, a circuit may be provided in which the delay elements 602 are connected in a plurality of stages and the time measurement end signal is delayed, for example.

However, in the aforementioned method, the time at which the counter memory 504 acquires a value is later than the time at which the time measurement end signal is input, and therefore there exists the condition that the counter memory 504 acquires a value after 1 has been added to the count value for the time at which the time measurement end signal was input, and there is a risk of an erroneous value being acquired.

In order to avoid this, in the time-digital converter 104b in the nonvolatile memory device according to the present embodiment, a sampling memory 1302 and a correction circuit 1303 have been added, as depicted in FIG. 13.

The sampling memory 1302 acquires the value of the least significant bit (output from the first-stage flip-flop 803) of the counter 502 at the same time as when the time measurement end signal is input. It should be noted that the sampling memory 1302 corresponds to a third memory circuit in the present disclosure.

Furthermore, the correction circuit 1303 corrects a count value on the basis of predetermined determination criteria, from the delay memory 503, the counter memory 504, and the sampling memory 1302. It should be noted that the predetermined determination criteria, as an example, as described hereinafter, refers to the case where the time measurement end signal changes from 0 to 1, the output of the counter memory 504 (in other words, the data saved in the counter memory 504) is not 0, the output of the delay memory 503 (in other words, the data saved in the delay memory 503) is a value that is in the latter half of one period (for example, E, F, G, and H depicted in FIG. 6), and the value of the least significant bit of the counter memory 504 and the value of the sampling memory 1302 are not the same.

The processing procedure therefor is given in the flowchart of FIG. 14. When the time measurement end signal that is input to the time-digital converter 104b changes from 0 to 1 (yes in step S11), after values have been acquired by the delay memory 503, the counter memory 504, and the sampling memory 1302, the correction circuit 1303 confirms whether the output of the counter memory 504 is not 0 (to be accurate, 0000 in the case of four bits) (step S12).

If the output of the counter memory 504 is not 0 (no in step S12), the correction circuit 1303 refers to the value of the delay memory 503, and confirms whether it is within the range of the latter half (E, F, G, or H constituting the latter half of the output of one period of A to H indicated in embodiment 1, provided the delay elements 602 are constituted by four stages as in FIG. 6) (step S13).

If within the range of the latter half (yes in step S13), the correction circuit 1303 compares the value of the least significant bit of the counter memory 504 and the value of the sampling memory 1302, and confirms whether the value of the least significant bit of the counter memory 504 and the value of the sampling memory 1302 are different (step S14).

Here, if the value of the least significant bit of the counter memory 504 and the value of the sampling memory 1302 are not the same (no in step S14), and the entirety of the aforementioned condition is met, the counter memory 504 consequently acquires a value having 1 added to the count value for the time at which the time measurement end signal is input. Thus, the correction circuit 1303 performs a correction with which 1 is subtracted from the count value of the counter memory 504 (step S15). Thereafter, the correction circuit 1303 outputs the corrected count value to the decoder 505 (step S17).

Furthermore, in the case where the aforementioned condition is not met at all, the correction circuit 1303 takes the count value for the time at which the time measurement end signal is input, as it is as the count value of the counter memory 504 (step S16), and outputs the count value to the decoder 505 (step S17).

It should be noted that, in the aforementioned counter memory 504, a case has been given in which the value of the least significant bit in the counter memory 504 is acquired by the sampling memory 1302; however, a bit other than the least significant bit may be acquired by the sampling memory 1302 and used for a determination.

Figure 15:
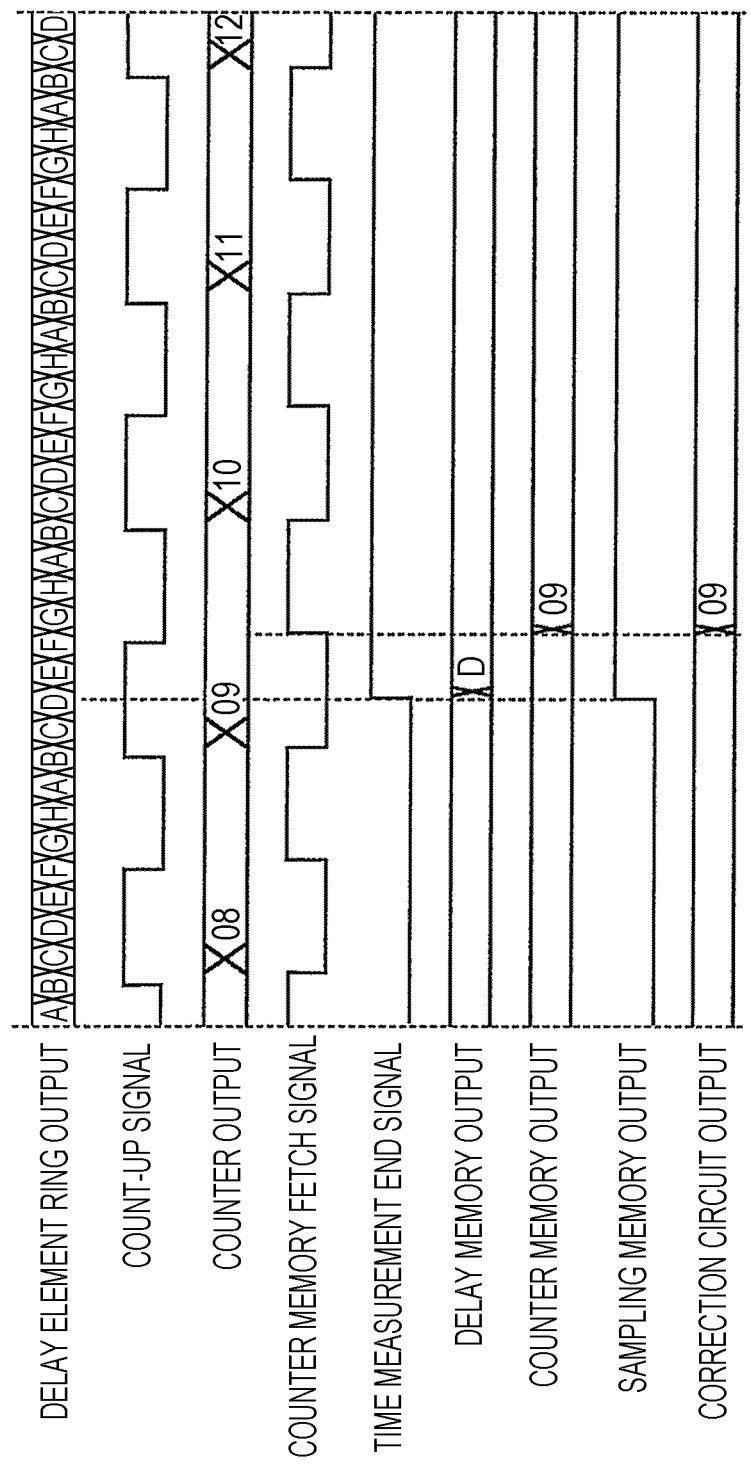
FIG. 15 is a first timing chart for the case where the correction circuit does not correct the count value according to embodiment 2.
Figure 16:
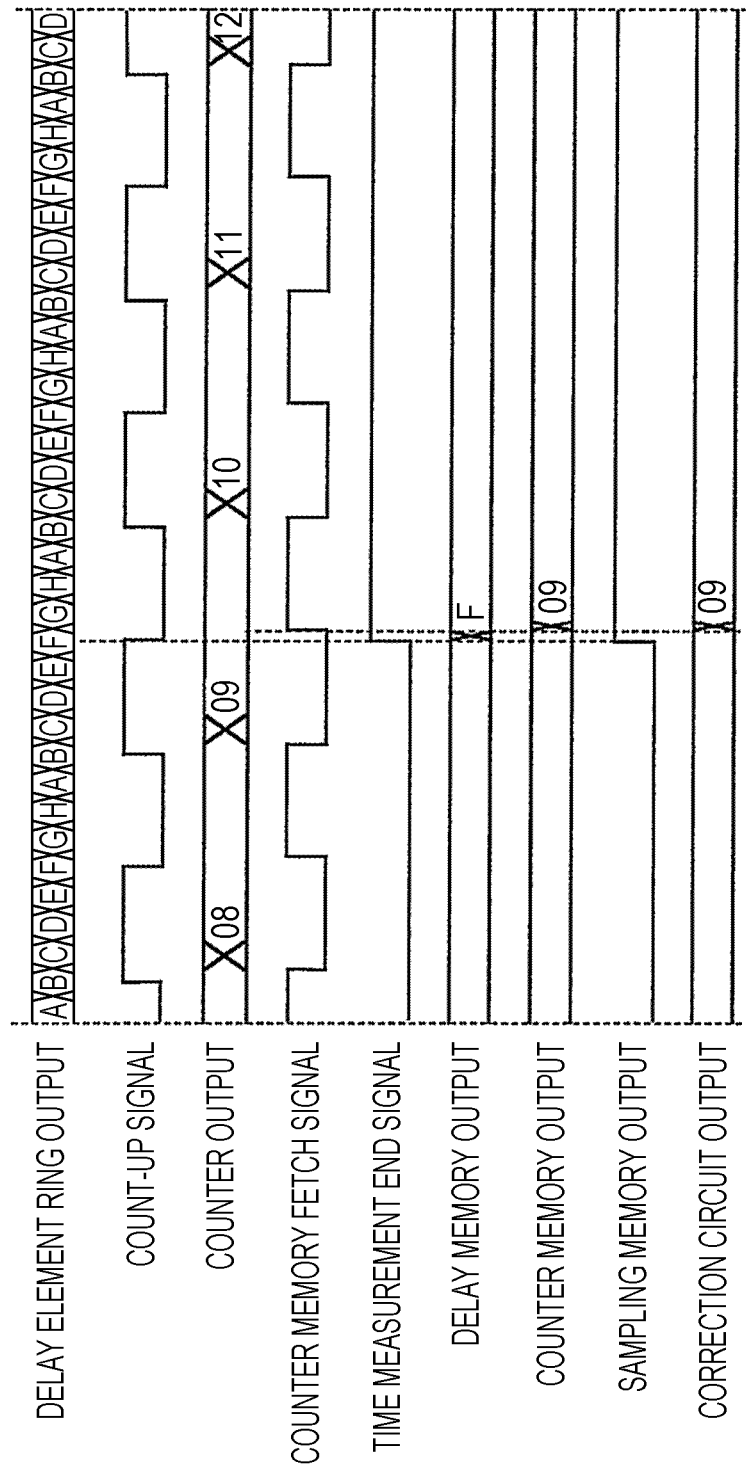
FIG. 16 is a second timing chart for the case where the correction circuit does not correct the count value according to embodiment 2.
Figure 17:
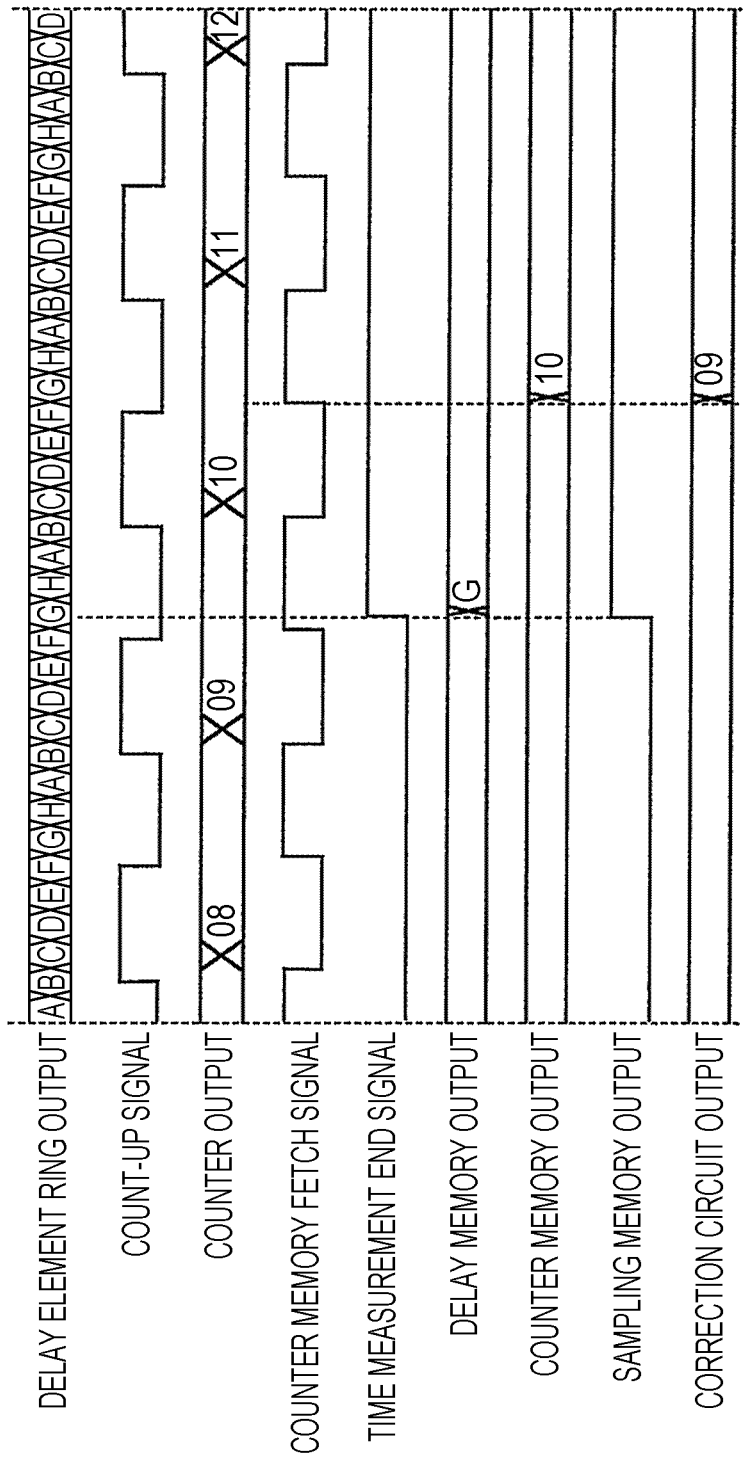
FIG. 17 is a timing chart for the case where the correction circuit corrects the count value according to embodiment 2.
Figure 18:
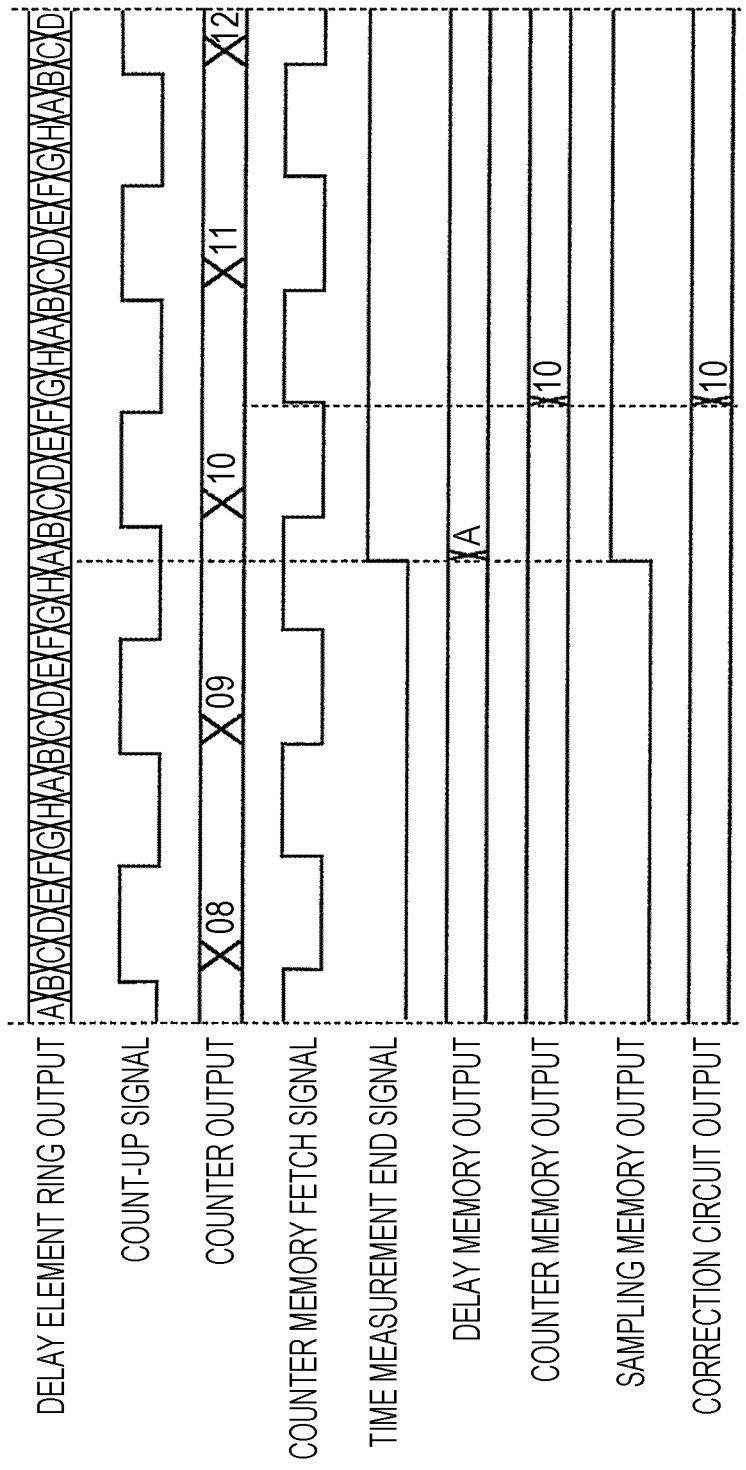
FIG. 18 is a third timing chart for the case where the correction circuit does not correct the count value according to embodiment 2.

Next, the effect of the correction circuit 1303 will be described by actually using a timing chart. An example of the case where the delay element ring 501 uses four bits (A to H), the counter 502 uses four bits, and the sampling memory 1302 uses the least significant one bit of the counter 502 is depicted in FIGS. 15 to 18. FIG. 15 is a first timing chart for the case where the correction circuit does not correct the count value according to the present embodiment. FIG. 16 is a second timing chart for the case where the correction circuit does not correct the count value according to the present embodiment. FIG. 17 is a timing chart for the case where the correction circuit corrects the count value according to the present embodiment. FIG. 18 is a third timing chart for the case where the correction circuit does not correct the count value according to the present embodiment. Here, more realistic timing charts are depicted, with a time delay being present in the count-up signal, the counter output, and the counter memory fetch signal.

In the timing chart depicted in FIG. 15, at the timing at which the time measurement end signal is input, the delay element ring output=D, the counter output=09, and the sampling memory output=1. Since the delay memory output=D, the counter memory output=09 (least significant bit=1), the delay memory 503 is in the first half (A to D), and the sampling memory output value and the least significant bit of the counter memory output match, the correction circuit 1303 outputs the value of the counter memory output as it is without subtracting 1 therefrom.

Next, in the timing chart depicted in FIG. 16, at the timing at which the time measurement end signal is input, the delay element ring output=F, the counter output=09, and the sampling memory output=1. Since the delay memory output=F, the counter memory output=09 (least significant bit=1), the delay memory 503 is in the latter half (E to H), and the sampling memory output value and the least significant bit of the counter memory output match, the correction circuit 1303 outputs the value of the counter memory output as it is without subtracting 1 therefrom.

Next, in the timing chart depicted in FIG. 17, at the timing at which the time measurement end signal is input, the delay element ring output=G, the counter output=09, and the sampling memory output =1. Since the delay memory output=G, the counter memory output=10 (least significant bit=0), the delay memory 503 is in the latter half (E to H), and the sampling memory output and the least significant bit of the counter memory output are different, the correction circuit 1303 outputs a value obtained by subtracting 1 from the value of the counter memory output.

Next, in the timing chart depicted in FIG. 18, at the timing at which the time measurement end signal is input, the delay element ring output=A, the counter output=10, and the sampling memory output=1. The reason the counter output=09 but the counter memory output=10 at the timing at which the time measurement end signal is input is because there is a delay in the counter output compared to the delay element ring output, and originally the correct value is the counter output=10. Since the delay memory output=0, the counter memory output=10 (least significant bit=0), the sampling memory output=1, and the delay memory is in the first half (A to D), the correction circuit outputs the value of the counter memory output as it is without subtracting 1 therefrom.

In this way, the correction circuit 1303 subtracts the value of the counter memory output in an appropriate manner, and a correct time is obtained.

Based on the above, according to the nonvolatile memory device according to the present embodiment, the effect of an operation delay of each bit of the counter 502 and an operation delay of the delay element ring 501 and counter 502 can be eliminated, and an accurate time measurement can be performed. It is possible to acquire an accurate resistance value (resistance value information) of the nonvolatile memory 101 from an accurate time obtained in this manner.

It should be noted that the method for eliminating the effect of the aforementioned operation delay is able to demonstrate said effect in all systems using the delay element ring 501 and counter 502, regardless of a variable-resistance nonvolatile memory.

Figure 25:
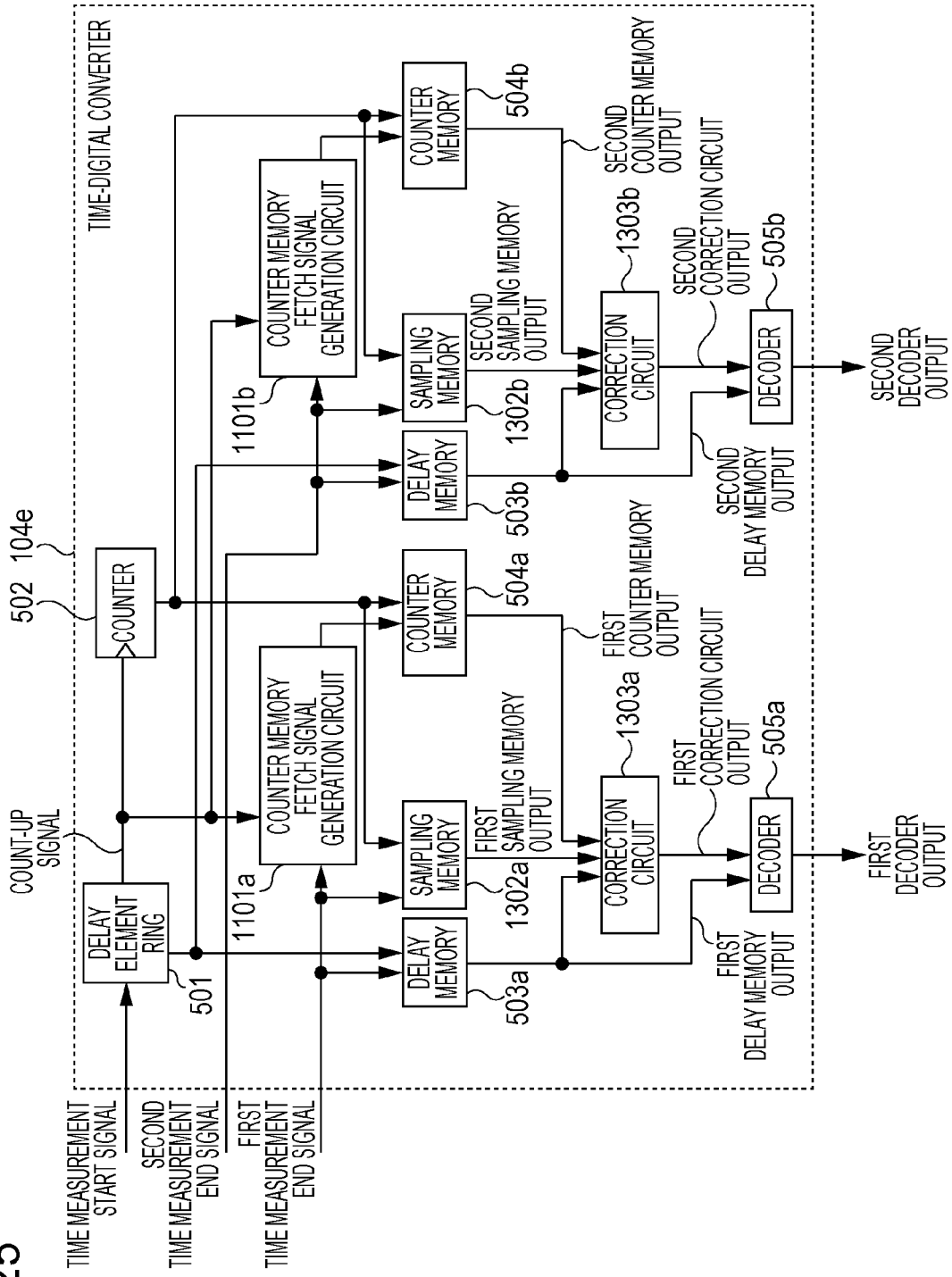
FIG. 25 is a block diagram depicting a time-digital converter according to a modified example of embodiment 2.

FIG. 25 depicts a time-digital converter 104e according to a modified example of embodiment 2.

The time-digital converter 104e includes the delay element ring 501, the counter 502, counter memory fetch signal generation circuits 1101a and 1101b, the delay memories 503a and 503b, sampling memories 1302a and 1302b, the counter memories 504a and 504b, correction circuits 1303a and 1303b, and the decoders 505a and 505b. The counter memory fetch signal generation circuit 1101a, the delay memory 503a, the sampling memory 1302a, the counter memory 504a, the correction circuit 1303a, and the decoder 505a constitute a first channel. The counter memory fetch signal generation circuit 1101b, the delay memory 503b, the sampling memory 1302b, the counter memory 504b, the correction circuit 1303b, and the decoder 505b constitute a second channel.

The configurations of the counter memory fetch signal generation circuits 1101a and 1101b are the same as that of the aforementioned counter memory fetch signal generation circuit 1101, for example. The configurations of the delay memories 503a and 503b are the same as that of the aforementioned delay memory 503, for example. The configurations of the sampling memories 1302a and 1302b are the same as that of the aforementioned sampling memory 1302, for example. The constituent operations of the counter memories 504a and 504b are the same as that of the aforementioned counter memory 504, for example. The configurations of the correction circuits 1303a and 1303b are the same as that of the aforementioned correction circuit 1303, for example. The configurations of the decoders 505a and 505b is the same as that of the aforementioned decoder 505, for example.

The operations in the channels of the time-digital converter 104e are the same as that described above as the operations of the counter memory fetch signal generation circuit 1101, the delay memory 503, the sampling memory 1302, the counter memory 504, the correction circuit 1303, and the decoder 505, for example.

The first channel outputs information regarding the time from the time measurement start time to the first time measurement end time as first decoder output on the basis of the time measurement start signal and the first time measurement end signal. The second channel outputs information regarding the time from the time measurement start time to the second time measurement end time as second decoder output on the basis of the time measurement start signal and the second time measurement end signal. The time-digital converter 104e is thereby able to output a plurality of items of time information in parallel on the basis of different time measurement end signals. Therefore, for example, a reading device that includes the time-digital converter 104e and a plurality of resistance-time converters is able to acquire information regarding the resistance values of a plurality of nonvolatile memories in parallel.

It should be noted that the time-digital converter 104e may be provided with three or more channels. The time-digital converter 104e is thereby able to acquire three or more items of time information. It should be noted that, in the time-digital converter 104e, a decoder does not have to be provided for each channel, and may be shared by a plurality of channels. In this case, for example, the decoder selectively acquires one set of delay memory output and counter memory output from a plurality of channels, and generates one item of decoder output on the basis thereof. Thus, a plurality of items of decoder output can be output from one decoder.

Embodiment 3

Figure 19:
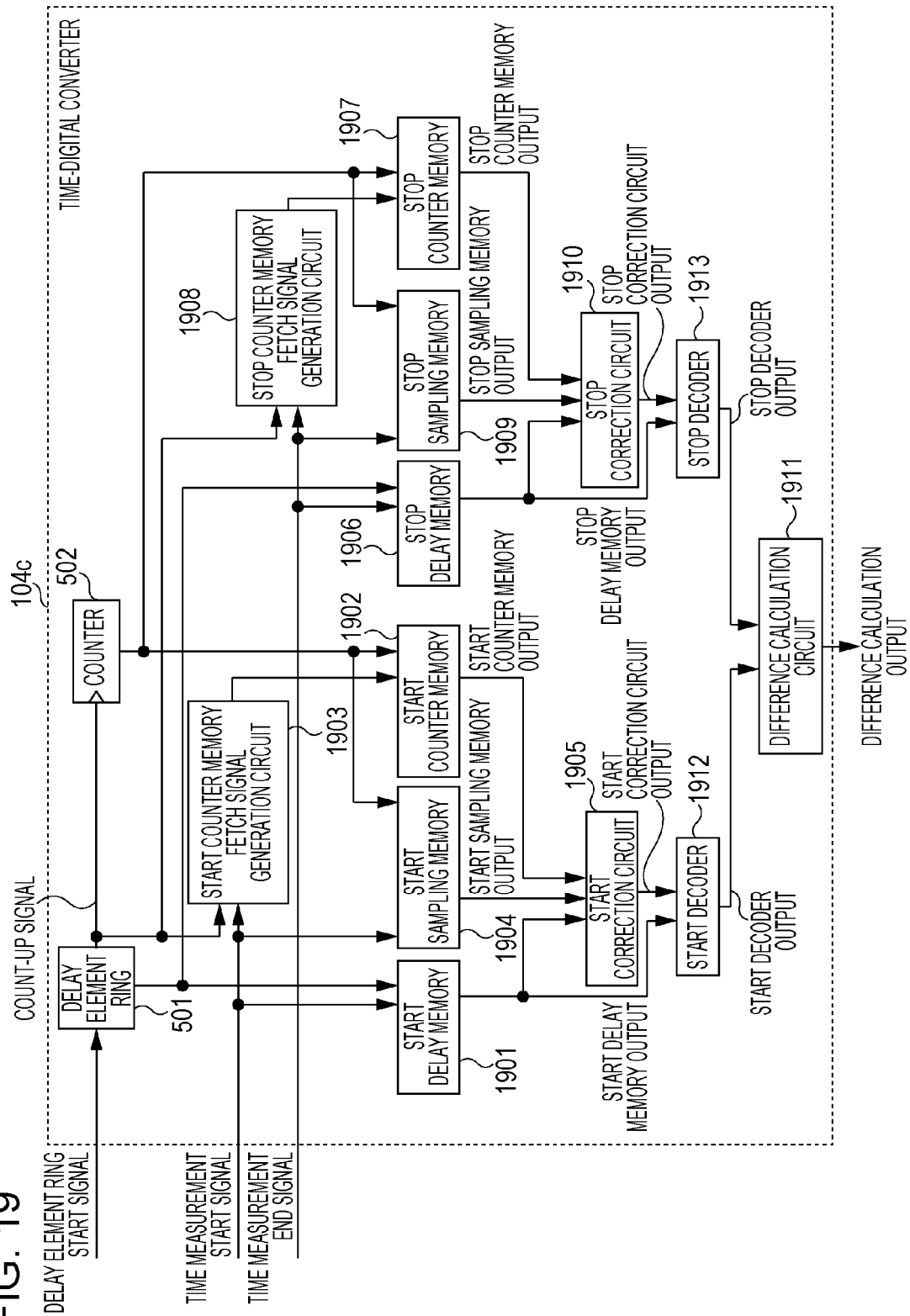
FIG. 19 is a block diagram depicting an example of a configuration in which both the time of a time measurement start time and the time of a time measurement end time of a time-digital converter are saved and the difference is output according to embodiment 3.

Next, a nonvolatile memory device according to embodiment 3 will be described using FIG. 19. FIG. 19 is a block diagram depicting an example of a configuration in which both the time of a time measurement start time and the time of a time measurement end time of a time-digital converter are saved and the difference is output according to the present embodiment.

In the nonvolatile memory device according to the aforementioned embodiment, the delay element ring 501 and the counter 502 start operating from the time measurement start signal being input, the states (saved data) of the delay element ring 501 and the counter 502 when the time measurement end signal is input are saved in the delay memory 503, the counter memory 504, and the sampling memory 1302, and reference is made to said states to thereby measure the time from the time measurement start to the time measurement end. As a result, there have been cases where a phenomenon occurs in which the delay amount changes for a while after the delay element ring 501 has started operating, and then stabilizes after a fixed time. Therefore, for an accurate time measurement, it is desirable for the time measurement to be started once the operation of the delay element ring 501 has stabilized.

Thus, in the nonvolatile memory device according to the present embodiment, as depicted in FIG. 19, a configuration is adopted in which a memory that saves the time measurement start time and a memory that saves the time measurement end time are provided separately in a time-digital converter 104c. The stability of the time measurement can thereby be improved.

As depicted in FIG. 19, the time-digital converter 104c is provided with, as a configuration for saving the time measurement start time, a start delay memory 1901, a start counter memory 1902, a start counter memory fetch signal generation circuit 1903, a start sampling memory 1904, a start correction circuit 1905, and a start decoder 1912.

Furthermore, the time-digital converter 104c is provided with, as a configuration for saving the time measurement end time, a stop delay memory 1906, a stop counter memory 1907, a stop counter memory fetch signal generation circuit 1908, a stop sampling memory 1909, a stop correction circuit 1910, and a stop decoder 1913. In addition, the time-digital converter 104c is provided with a difference calculation circuit 1911 that calculates and outputs the difference between a saved time measurement start time and time measurement end time.

In the time-digital converter 104c, when a delay element ring start signal is input to the delay element ring 501, the delay element ring 501 and the counter 502 start operating. After the operation of the delay element ring 501 has stabilized, the time measurement start signal is input to the time-digital converter 104c. Thus, the state of the delay element ring 501 is saved in the start delay memory 1901, and the state of the counter 502 is saved in the start sampling memory 1904 and the start counter memory 1902. Then, in a similar manner to the correction circuit 1303 indicated in embodiment 2, the counter memory output for when the time measurement start signal was input is corrected by the start correction circuit 1905. In addition, the corrected counter memory output is output to the start decoder 1912 as a start correction circuit output.

Thereafter, in the time-digital converter 104c, when the time measurement end signal is input, the state of the delay element ring 501 is saved in the stop delay memory 1906, and the state of the counter 502 is saved in the stop sampling memory 1909 and the stop counter memory 1907. Then, in a similar manner to the correction circuit 1303 indicated in embodiment 2, the counter memory output for when the time measurement end signal was input is corrected by the stop correction circuit 1910, and the corrected counter memory output is output to the start decoder 1912 as a stop correction circuit output.

In addition, the start decoder output is input from the start decoder 1912 and the stop decoder output is input from the stop decoder 1913 to the difference calculation circuit 1911. The difference calculation circuit 1911 calculates the difference between a correction value for the time at which the start decoder output, in other words, the time measurement start signal was input and a correction value for the time at which the time measurement end signal was input, and outputs the difference as a difference calculation output. Thus, it is possible to start a time measurement after the operation of the delay element ring 501 has stabilized, and it is therefore possible to obtain a more accurate time. It is possible to acquire an accurate resistance value (resistance value information) of the nonvolatile memory 101 from an accurate time obtained in this manner.

Figure 26:
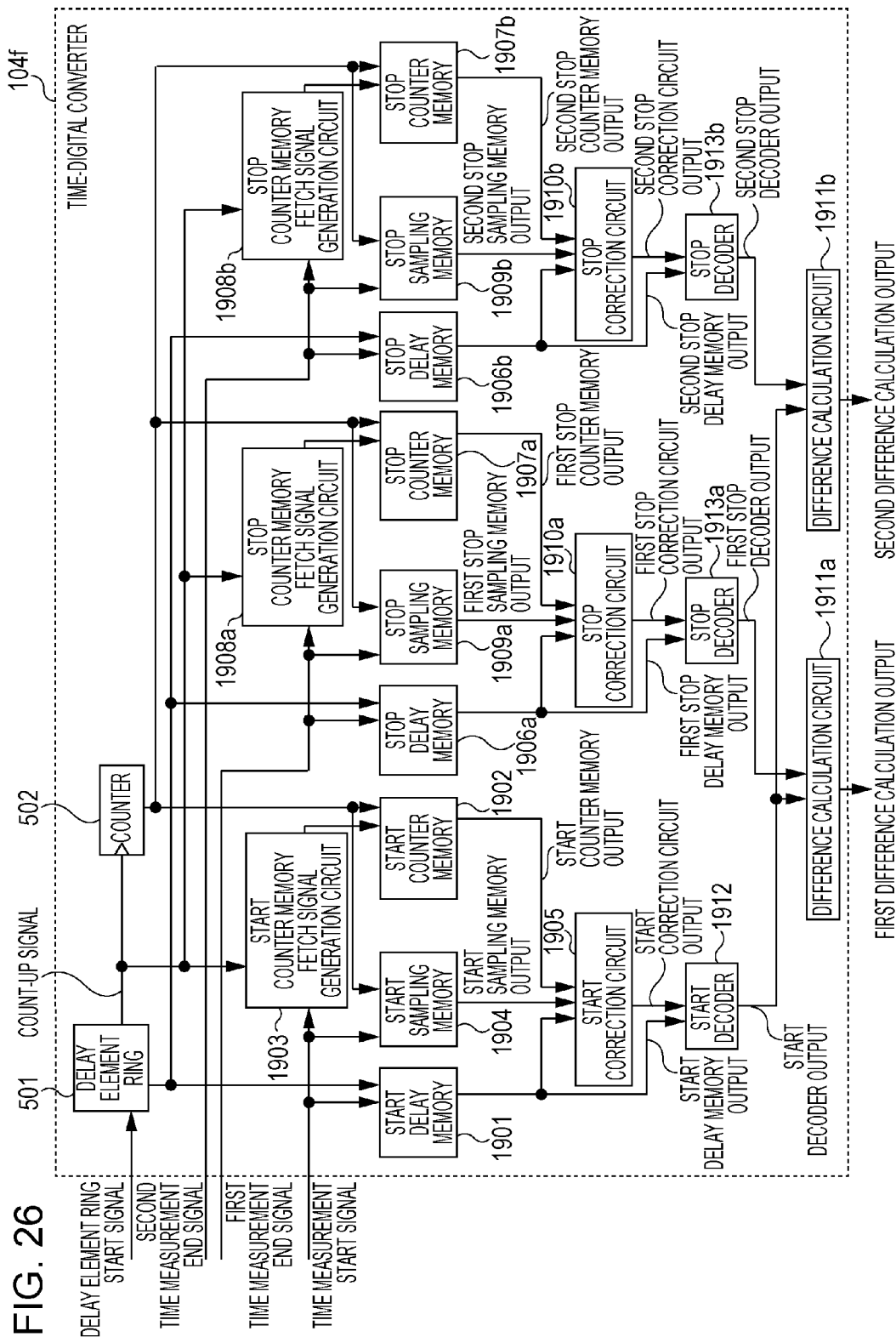
FIG. 26 is a block diagram depicting a time-digital converter according to a modified example of embodiment 3.

FIG. 26 depicts a time-digital converter 104f according to a modified example of embodiment 3.

The time-digital converter 104f includes the delay element ring 501, the counter 502, the start counter memory fetch signal generation circuit 1903, the start delay memory 1901, the start sampling memory 1904, the start counter memory 1902, the start correction circuit 1905, the start decoder 1912, stop counter memory fetch signal generation circuits 1908a and 1908b, stop delay memories 1906a and 1906b, stop sampling memories 1909a and 1909b, stop counter memories 1907a and 1907b, stop correction circuits 1910a and 1910b, stop decoders 1913a and 1913b, and difference calculation circuits 1911a and 1911b. The start counter memory fetch signal generation circuit 1903, the start delay memory 1901, the start sampling memory 1904, the start counter memory 1902, the start correction circuit 1905, and the start decoder 1912 constitute a start channel. The stop counter memory fetch signal generation circuit 1908a, the stop delay memory 1906a, the stop sampling memory 1909a, the stop counter memory 1907a, the stop correction circuit 1910a, and the stop decoder 1913a constitute a first stop channel. The stop counter memory fetch signal generation circuit 1908b, the stop delay memory 1906b, the stop sampling memory 1909b, the stop counter memory 1907b, the stop correction circuit 1910b, and the stop decoder 1913b constitute a second stop channel.

The configurations of the stop counter memory fetch signal generation circuits 1908a and 1908b are the same as that of the aforementioned stop counter memory fetch signal generation circuit 1908, for example. The configurations of the stop delay memories 1906a and 1906b are the same as that of the aforementioned stop delay memory 1906, for example. The configurations of the stop sampling memories 1909a and 1909b are the same as that of the aforementioned stop sampling memory 1909, for example. The configurations of the stop counter memories 1907a and 1907b are the same as that of the aforementioned stop counter memory 1907, for example. The configurations of the stop correction circuits 1910a and 1910b are the same as that of the aforementioned stop correction circuit 1910, for example. The configurations of the stop decoders 1913a and 1913b are the same as that of the aforementioned stop decoder 1913, for example. The configurations of the difference calculation circuit 1911a and 1911b are the same as that of the aforementioned difference calculation circuit 1911, for example.

The operations in the stop channels of the time-digital converter 104f are the same as that described above as the operations of the stop counter memory fetch signal generation circuit 1908, the stop delay memory 1906, the stop sampling memory 1909, the stop counter memory 1907, the stop correction circuit 1910, and the stop decoder 1913, for example.

The start channel outputs information regarding the time from the start time of the delay element ring to the time measurement start time as start decoder output on the basis of a delay element ring start signal and the time measurement start signal. The first stop channel outputs information regarding the time from the start time of the delay element ring to the first time measurement end time as first stop decoder output on the basis of the delay element ring start signal and the first time measurement end signal. The difference calculation circuit 1911a outputs information regarding the time from the time measurement start time to the first time measurement end time as first difference calculation output on the basis of the start decoder output and the first stop decoder output. The second stop channel outputs information regarding the time from the start time of the delay element ring to the second time measurement end time as second stop decoder output on the basis of the delay element ring start signal and the second time measurement end signal. The difference calculation circuit 1911b outputs information regarding the time from the time measurement start time to the second time measurement end time as second difference calculation output on the basis of the start decoder output and the second stop decoder output. The time-digital converter 104f is thereby able to output a plurality of items of time information in parallel on the basis of different time measurement end signals. Therefore, for example, a reading device that includes the time-digital converter 104f and a plurality of resistance-time converters is able to acquire information regarding the resistance values of a plurality of nonvolatile memories in parallel.

It should be noted that the time-digital converter 104f may be provided with three or more channels. The time-digital converter 104f is thereby able to acquire three or more items of time information. It should be noted that, in the time-digital converter 104f, a decoder does not have to be provided for each channel, and may be shared by a plurality of channels. In this case, for example, the decoder selectively acquires one set of delay memory output and counter memory output from a plurality of channels, and generates one item of decoder output on the basis thereof. Thus, a plurality of items of decoder output can be output from one decoder.

Embodiment 4

Figure 20:
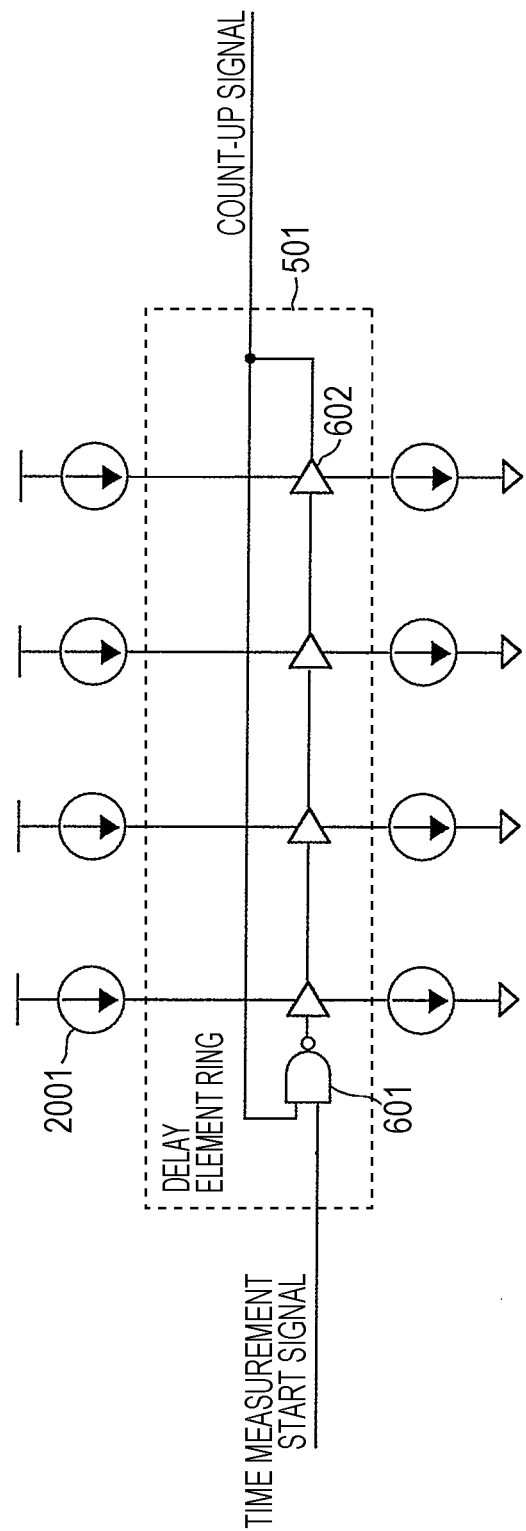
FIG. 20 is a circuit diagram depicting an example of a configuration in which a current amount of a delay element ring can be changed according to embodiment 4.
Figure 21:
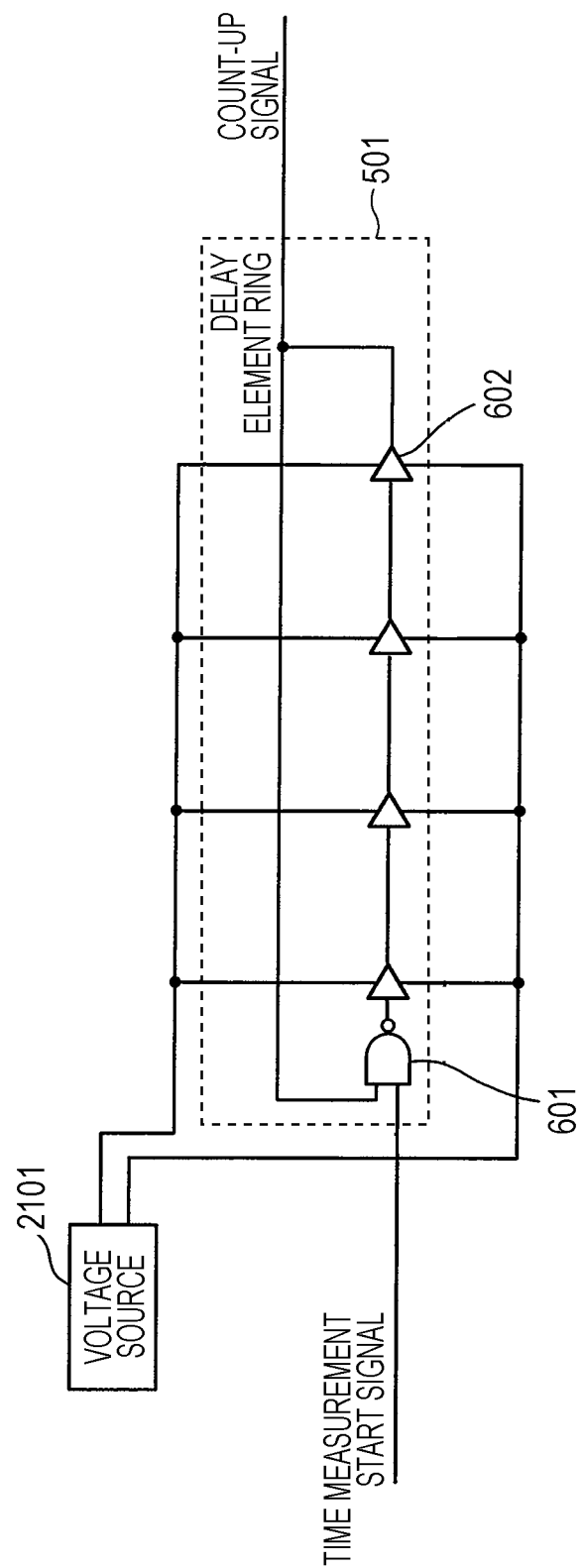
FIG. 21 is a circuit diagram depicting an example of a configuration in which a voltage amount of the delay element ring can be changed according to embodiment 4.
Figure 22:
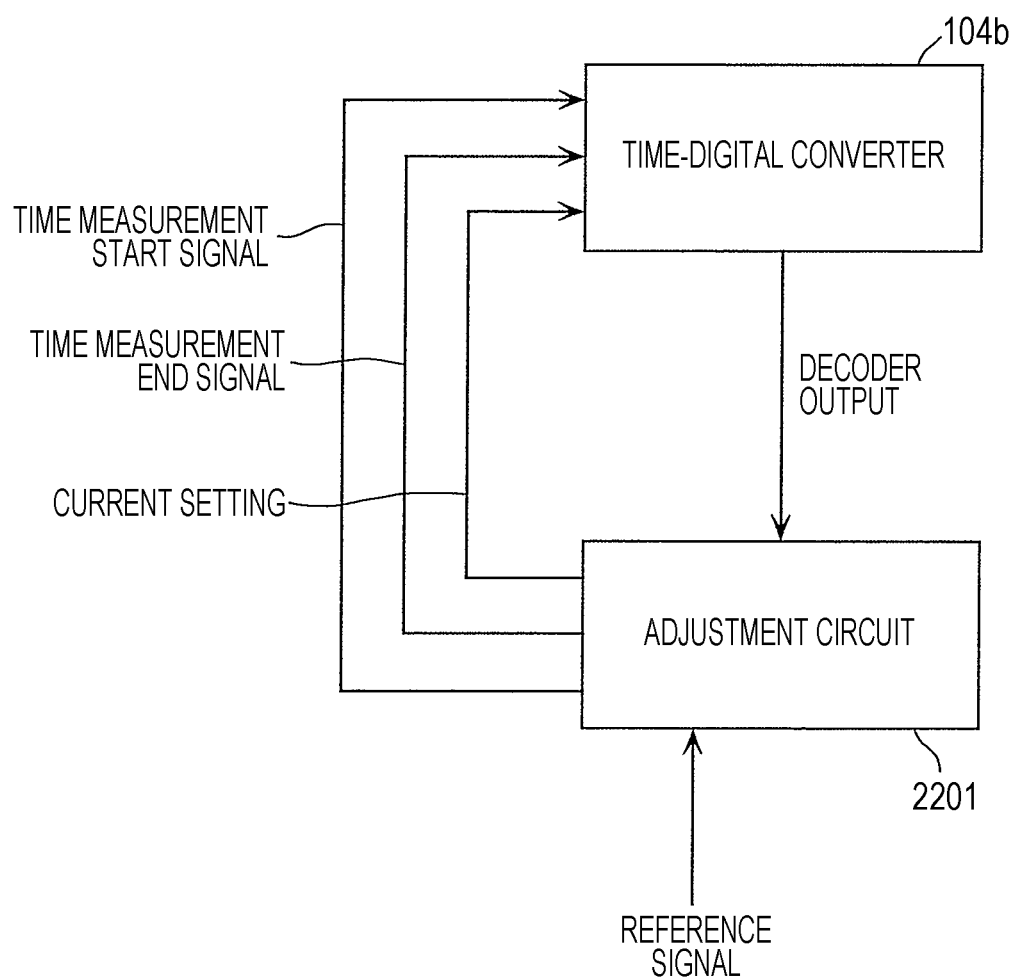
FIG. 22 is a block diagram depicting an example of a configuration in which the current amount of the delay element ring is adjusted according to embodiment 4.
Figure 23:
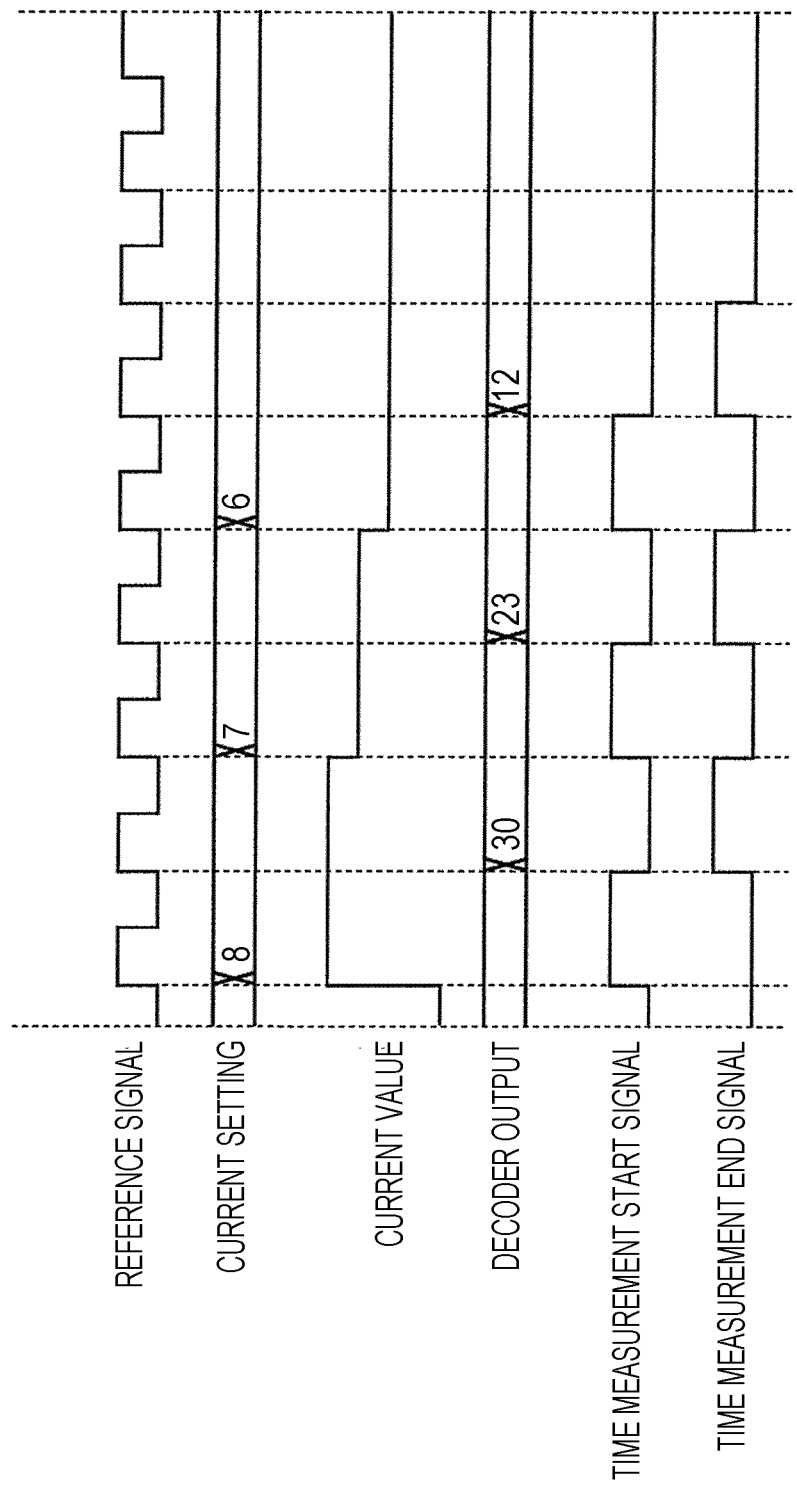
FIG. 23 is a timing chart for the case where the current amount of the delay element ring is adjusted according to embodiment 4.

Next, a nonvolatile memory device according to embodiment 4 will be described using FIGS. 20 to 23. FIG. 20 is a circuit diagram depicting an example of a configuration in which a current amount of a delay element ring can be changed according to the present embodiment. FIG. 21 is a circuit diagram depicting an example of a configuration in which a voltage amount of a delay element ring can be changed according to the present embodiment. FIG. 22 is a block diagram depicting an example of a configuration in which the current amount of the delay element ring is adjusted according to the present embodiment. FIG. 23 is a timing chart for the case where the current amount of the delay element ring is adjusted according to the present embodiment.

It is ideal for the delay elements 602 of the delay element ring 501 to always have the same delay amount; however, in practice, there are cases where the delay time (delay amount) of a signal that is output from the delay element ring 501 changes due to manufacturing variations and temperature fluctuations. Thus, as disclosed in FIG. 20, a configuration is adopted in which current sources 2001 are provided on the source side and the ground side of the delay elements 602 so that the current amount can be changed. For example, when the current amount flowing to the delay elements 602 is decreased, the delay amount increases. By adjusting the current amount that flows to the delay elements 602 by means of the current sources 2001, it is possible to obtain a desired delay amount in the delay element ring 501.

Furthermore, a method in which a voltage is supplied from a voltage source 2101 to the source side and the ground side of the delay elements 602 as in FIG. 21 is also feasible. For example, when the source voltage or the ground voltage of the delay elements 602 is restricted, the delay amount increases. By adjusting the magnitude of the voltage supplied to the delay elements 602 by means of the voltage source 2101, it is possible to obtain a desired delay amount in the delay element ring 501.

In addition, the nonvolatile memory device may be provided with an adjustment circuit 2201 that can adjust the current amount or the voltage amount, instead of the aforementioned current sources 2001 and voltage source 2101. The adjustment circuit 2201 changes the delay time of the delay elements 602 in such a way that the time difference from the time at which the time measurement start signal is input to the time at which the time measurement end signal is input becomes a predetermined target value. At such time, the time measurement start signal and the time measurement end signal may be generated according to the reference signal that is input from outside. Specifically, this may be performed as follows.

FIG. 22 depicts a block diagram for the case where the delay amount is to be adjusted. Here, the case where the current amount is to be adjusted will be described. In this case, it is assumed that the time-digital converter depicted in FIG. 13 is used for the time-digital converter 104, and the adjustment circuit 2201 is mounted with the configuration capable of adjusting the current amount depicted in FIG. 20. Furthermore, FIG. 23 depicts a timing chart for the case where the delay elements 602 are to be adjusted to have a desired delay amount.

An output value of the decoder 505 that serves as the target value is equal to or greater than 10 and equal to or less than 15, for example. The reference signal is a clock signal having a stable period of a crystal oscillator or the like, and is used in the adjustment circuit 2201. The adjustment circuit 2201 outputs a current setting and a time measurement start signal at the same time as when the reference signal rises, and inputs a time measurement end signal at the clock signal that is immediately subsequent to the reference signal or a clock signal that is a few signals subsequent to the reference signal. Decoder output is thereby obtained from the decoder 505 of the time-digital converter 104b. In the case where the decoder output from the decoder 505 is not the target value (equal to or greater than 10 and equal to or less than 15), the adjustment circuit 2201, at the same time as when the reference signal rises once again, outputs a current setting that is different from the aforementioned and a time measurement start signal, and inputs a time measurement end signal at the clock signal that is immediately subsequent to the reference signal or a clock signal that is a few signals subsequent to the reference signal. New decoder output is thereby obtained from the decoder 505 of the time-digital converter 104b. The aforementioned is repeated, and the adjustment is finished when the decoder output reaches the target value.

If the aforementioned method is used, it is possible to adjust the delay amount of the delay elements 602 of the delay element ring 501, and to obtain a desired delay amount. If the current amount is adjusted immediately prior to a time being converted into a digital value by the time-digital converter 104, deviations in delay amounts caused by not only manufacturing variations of the delay elements 602 but also temperature and source voltage fluctuations can also be corrected, and a target delay amount can be obtained.

Hereinabove, a nonvolatile memory device according to embodiments of the present disclosure has been described; however, the present disclosure is not restricted to these embodiments.

For example, the counter circuit may measure the number of times that a rising edge occurs or may measure the number of times that a falling edge occurs in the output of any of a plurality of delay elements.

Furthermore, an AND element may be used instead of a NAND element in the delay element ring. Furthermore, the delay element ring may be configured of only a delay element and a delay flip-flop without using a NAND element. In these cases, a mechanism with which the output of the delay element is returned to the original state may be newly provided.

Furthermore, the aforementioned counter memory fetch signal generation circuit does not have to be configured of an inversion element and a flip-flop circuit, and may delay a time measurement end signal with delay elements being connected in a plurality of stages, for example.

Furthermore, in the aforementioned embodiments, one threshold value for determining a resistance value has been given; however, there may be a plurality of threshold values for determining a resistance value. In the aforementioned embodiments, data of 1 or 0 is stored in a nonvolatile memory; however, other data may be stored due to increasing the threshold values for determining a resistance value.

Furthermore, a nonvolatile memory device has been described in the aforementioned embodiments; however, an integrated circuit card provided with a nonvolatile memory device having the aforementioned features is also included in the present disclosure.

Furthermore, the method for eliminating the effect of the aforementioned operation delays may be used for all systems that use a delay element ring and a counter, regardless of a variable-resistance nonvolatile memory.

Hereinabove, a nonvolatile memory device according to one or more aspects has been described on the basis of the embodiments; however, the present disclosure is not restricted to these embodiments. Modes in which various modifications conceived by a person skilled in the art have been implemented in the present embodiments, and modes constructed by combining the constituent elements in different embodiments may also be included within the scope of one or more aspects provided they do not depart from the purpose of the present disclosure.

Supplement

In FIG. 5, the nonvolatile memory device 100a is provided with the nonvolatile memory 101, the resistance-time converter 103, and the time-digital converter 104a.

The nonvolatile memory 101 stores predetermined information (for example, 0 or 1) corresponding to a resistance value thereof.

The resistance-time converter 103 outputs a time measurement end signal at a timing corresponding to the resistance value of the nonvolatile memory 101. The resistance-time converter 103 includes the capacitor 201 and the comparator 202. The capacitor 201 is able to electrically connect to the nonvolatile memory 101. Charge corresponding to the resistance value of the nonvolatile memory 101 is accumulated in the capacitor 201. Therefore, the potential of the capacitor 201 decreases at a speed corresponding to the resistance value of the nonvolatile memory 101, due to discharging of the capacitor 201. Alternatively, the potential of the capacitor 201 increases at a speed corresponding to the resistance value of the nonvolatile memory 101, due to charging of the capacitor 201. The comparator 202 compares the potential of the capacitor 201 and a reference potential VREF, and outputs a time measurement end signal in accordance with the result thereof. It should be noted that the "capacitor" in the present disclosure is not restricted to a device and may be parasitic capacitance, for example.

The time measurement start signal and the time measurement end signal are input to the time-digital converter 104a. The time-digital converter 104a converts the time from the time measurement start signal being input to the time measurement end signal being input into a digital value.

The time-digital converter 104a includes the delay element ring 501, the counter 502, the delay memory 503, the counter memory 504, and the decoder 505.

As depicted in FIG. 6, the delay element ring 501 includes the plurality of delay elements 602, and these are connected in a ring form. Each of the plurality of delay elements 602 is a digital buffer, for example. The plurality of delay elements 602 output the outputs D0 to D3. In FIG. 6, the delay element ring 501 includes the NAND element 601. In accordance with the time measurement start signal, the NAND element 601 inverts the output D3 from the final-stage delay element 602, and outputs the inverted value to the first-stage delay element 602. Thus, the outputs D0 to D3, for example, sequentially change each time a predetermined delay period elapses from the time measurement start signal being input to the first-stage delay element 602. It should be noted that this delay period may vary slightly. The delay element ring 501, for example, outputs the output D3 from the final-stage delay element 602 as a count-up signal. The delay memory 503 stores the outputs D0 to D3 of the plurality of delay elements 602 on the basis of the time measurement end signal.

As depicted in FIG. 8, the counter 502 counts the number of times that a rising edge occurs or the number of times that a falling edge occurs in the count-up signal. The counter memory 504 stores the outputs C0 to C3 of the counter 502 on the basis of the time measurement end signal.

The decoder 505 generates decoder output on the basis of the data D0 to D3 and the data C0 to C3. In the present disclosure, "on the basis of X" and "based on X" each mean X is directly or indirectly used.

The time measurement start signal is an example of a "start signal" in the present disclosure, and the time measurement end signal is an example of a "first end signal" in the present disclosure. The delay element ring 501 is an example of a "ring delay circuit" in the present disclosure, and the counter 502 is an example of a "counter circuit" in the present disclosure. The NAND element 601 is an example of an "inversion circuit" in the present disclosure. The delay memory 503 is an example of a "first memory circuit" in the present disclosure, and the counter memory 504 is an example of a "second memory circuit" in the present disclosure. The outputs D0 to D3 of the plurality of delay elements 602 are an example of "first data" in the present disclosure, and the outputs C0 to C3 of the counter 502 are an example of "second data" in the present disclosure. The decoder output of the decoder 505 is an example of "first digital data" in the present disclosure.

In FIG. 13, the time-digital converter 104b is additionally provided with the counter memory fetch signal generation circuit 1101, the sampling memory 1302, and the correction circuit 1303 in addition to the configuration of the time-digital converter 104a.

The counter memory fetch signal generation circuit 1101 causes the data C0 to C3 of the counter 502 to be acquired by the counter memory 504 after a predetermined period has elapsed from the time measurement end signal being input.

In the example depicted in FIG. 12, at the timing at which the output D3 of the final-stage delay element 602 rises, the count-up signal rises, and the counter 502 counts up. Then, after the time measurement end signal has been input, the counter memory fetch signal rises at the timing at which the output D3 falls. In this case, the counter memory 504 acquires the data C0 to C3 from the counter 502 in accordance with the counter memory fetch signal.

Alternatively, in a separate example, the time-digital converter 104b is provided with a delay circuit (not depicted) instead of the counter memory fetch signal generation circuit 1101. This delay circuit causes a time measurement end signal to be delayed by a predetermined delay time and then output to the counter memory 504. In this case, the counter memory 504 acquires the data C0 to C3 from the counter 502 in accordance with the delayed time measurement end signal.

The sampling memory 1302 receives a time measurement end signal not via the counter memory fetch signal generation circuit 1101, and, in accordance therewith, stores the output C0 of the first-stage flip-flop 803 of the counter 502.

The correction circuit 1303 generates data of the original count value or a corrected count value from the output of the delay memory 503, the sampling memory 1302, and the counter 502. The decoder 505 generates decoder output from the output of the delay memory 503 and the correction circuit 1303.

The counter memory fetch signal generation circuit 1101 and the aforementioned delay circuit are both examples of a "first delay circuit" in the present disclosure, the sampling memory 1302 is an example of a "first sampling memory circuit" in the present disclosure, and the correction circuit 1303 is an example of a "first correction circuit" in the present disclosure. The counter memory fetch signal is an example of a "fetch signal" in the present disclosure.

In FIG. 19, the time-digital converter 104c is provided with the delay element ring 501, the counter 502, the start counter memory fetch signal generation circuit 1903, the start delay memory 1901, the start sampling memory 1904, the start counter memory 1902, the start correction circuit 1905, the start decoder 1912, the stop counter memory fetch signal generation circuit 1908, the stop delay memory 1906, the stop sampling memory 1909, the stop counter memory 1907, the stop correction circuit 1910, the stop decoder 1913, and the difference calculation circuit 1911.

The start counter memory fetch signal generation circuit 1903 is an example of a "first delay circuit" in the present disclosure, and the stop counter memory fetch signal generation circuit 1908 is an example of a "second delay circuit" in the present disclosure. The start delay memory 1901 is an example of a "first memory circuit" in the present disclosure, and the stop delay memory 1906 is an example of a "third memory circuit" in the present disclosure. The start sampling memory 1904 is an example of a "first sampling memory circuit" in the present disclosure, and the stop sampling memory 1909 is an example of a "second sampling memory circuit" in the present disclosure. The start counter memory 1902 is an example of a "second memory circuit" in the present disclosure, and the stop counter memory 1907 is an example of a "fourth memory circuit" in the present disclosure. The start correction circuit 1905 is an example of a "first correction circuit" in the present disclosure, and the stop correction circuit 1910 is an example of a "second correction circuit" in the present disclosure. The start decoder 1912 is an example of a "first decoder" in the present disclosure, and the stop decoder 1913 is an example of a "second decoder" in the present disclosure. The difference calculation circuit 1911 is an example of a "first generation circuit" in the present disclosure.

In FIGS. 20 to 22, the current sources 2001, the voltage source 2101, or the adjustment circuit 2201 are connected to the delay element ring 501. Thus, the delay times of each of the plurality of delay elements 602 can be adjusted. The current sources 2001, the voltage source 2101, and the adjustment circuit 2201 are all examples of an "adjustment circuit" in the present disclosure.

In FIG. 22, the adjustment circuit 2201 generates a time measurement start signal for testing and a time measurement end signal for testing on the basis of a reference signal, and outputs the time measurement start signal and the time measurement end signal to the time-digital converter 104b. The time-digital converter 104b outputs the time from the time measurement start signal being input to the time measurement end signal being input as decoder output. The adjustment circuit 2201 determines whether or not the value of the decoder output is within a predetermined range. If the value of the decoder output is not within the predetermined range, the adjustment circuit 2201 adjusts the delay times of each of the plurality of delay elements 602.

The time measurement start signal for testing is an example of a "first test signal" in the present disclosure, and the time measurement end signal for testing is an example of a "second test signal" in the present disclosure. Decoder output that is output from the time-digital converter 104b to the adjustment circuit 2201 is an example of a "digital value" in the present disclosure.

In FIG. 24, the time-digital converter 104d includes the delay element ring 501, the counter 502, the delay memories 503a and 503b, the counter memories 504a and 504b, and the decoders 505a and 505b.

The first time measurement end signal is an example of a "first end signal" in the present disclosure, and the second time measurement end signal is an example of a "second end signal" in the present disclosure. The delay memory 503a is an example of a "first memory circuit" in the present disclosure, and the delay memory 503b is an example of a "third memory circuit" in the present disclosure. The counter memory 504a is an example of a "second memory circuit" in the present disclosure, and the counter memory 504b is an example of a "fourth memory circuit" in the present disclosure. Data that is output from the delay element ring 501 to the delay memory 503a is an example of "first data" in the present disclosure, and data that is output from the counter 502 to the counter memory 504a is an example of "second data" in the present disclosure. Data that is output from the delay element ring 501 to the delay memory 503b is an example of "third data" in the present disclosure, and data that is output from the counter 502 to the counter memory 504b is an example of "fourth data" in the present disclosure. The decoder output of the decoder 505a is an example of a "first digital data" in the present disclosure, and the decoder output of the decoder 505b is an example of a "second digital data" in the present disclosure.

In FIG. 25, the time-digital converter 104e is additionally provided with the counter memory fetch signal generation circuits 1101a and 1101b, the sampling memories 1302a and 1302b, and the correction circuits 1303a and 1303b in addition to the configuration of the time-digital converter 104d.

The counter memory fetch signal generation circuit 1101a is an example of a "first delay circuit" in the present disclosure, and the counter memory fetch signal generation circuit 1101b is an example of a "second delay circuit" in the present disclosure. The sampling memory 1302a is an example of a "first sampling memory circuit" in the present disclosure, and the sampling memory 1302b is an example of a "second sampling memory circuit" in the present disclosure. The correction circuit 1303a is an example of a "first correction circuit" in the present disclosure, and the correction circuit 1303b is an example of a "second correction circuit" in the present disclosure.

In FIG. 26, the time-digital converter 104f is provided with the delay element ring 501, the counter 502, the start counter memory fetch signal generation circuit 1903, the start delay memory 1901, the start sampling memory 1904, the start counter memory 1902, the start correction circuit 1905, the start decoder 1912, the stop counter memory fetch signal generation circuits 1908a and 1908b, the stop delay memories 1906a and 1906b, the stop sampling memories 1909a and 1909b, the stop counter memories 1907a and 1907b, the stop correction circuits 1910a and 1910b, the stop decoders 1913a and 1913b, and the difference calculation circuits 1911a and 1911b.

The stop delay memory 1906a is an example of a "third memory circuit" in the present disclosure. The stop delay memory 1906b is an example of a "fifth memory circuit" in the present disclosure. The stop sampling memory 1909a is an example of a "second sampling memory circuit" in the present disclosure, and the stop sampling memory 1909b is an example of a "third sampling memory circuit" in the present disclosure. The stop counter memory 1907a is an example of a "fourth memory circuit" in the present disclosure, and the stop counter memory 1907b is an example of a "sixth memory circuit" in the present disclosure. The stop correction circuit 1910a is an example of a "second correction circuit" in the present disclosure, and the stop correction circuit 1910b is an example of a "third correction circuit" in the present disclosure. The stop decoder 1913a is an example of a "second decoder" in the present disclosure, and the stop decoder 1913b is an example of a "third decoder" in the present disclosure. The difference calculation circuit 1911a is an example of a "first generation circuit" in the present disclosure, and the difference calculation circuit 1911b is an example of a "second generation circuit" in the present disclosure.

The nonvolatile memory device according to the present disclosure is useful mounted in an IC, SoC, or the like which implements the access that accompanies authentication for data encryption, host computers, and servers.

What is claimed is:

1. A nonvolatile memory device, comprising:
   a first nonvolatile memory that stores information in association with a resistance value of the first nonvolatile memory;
   a first resistance-time converter that outputs a first end signal at timing according to the resistance value of the first nonvolatile memory, the first resistance-time converter being connected to the first nonvolatile memory; and
   a time-digital converter that measures a first time from input of a start signal to input of the first end signal and converts the measured first time into a first digital value,
   wherein the time-digital converter includes:
     a ring delay circuit that includes delay elements connected in a ring configuration;
     a counter circuit that counts a number of times of a rising edge or a number of times of a falling edge in output of one of the delay elements;
     a first memory circuit that stores, based on the first end signal, outputs of the delay elements as first data; and
     a second memory circuit that stores, based on the first end signal, a count value of the counter circuit as second data.

2. The nonvolatile memory device according to claim 1, further comprising:
   a second nonvolatile memory that stores information in association with a resistance value of the second nonvolatile memory; and
   a second resistance-time converter that outputs a second end signal to the time digital converter at timing according to the resistance value of the second nonvolatile memory, the second resistance-time converter being connected to the second nonvolatile memory,
   wherein the time-digital converter further measures a second time from the input of the start signal to input of the second end signal and converts the measured second time into a second digital value, and
   the time-digital converter further includes:

a third memory circuit that stores, based on the second end signal, the outputs of the delay elements as third data; and a fourth memory circuit that stores, based on the second end signal, the count value of the counter circuit as fourth data.

3. The nonvolatile memory device according to claim 2, wherein the time-digital converter further includes:

a first decoder that generates the first digital value based on the first data and the second data a second decoder that generates the second digital value based on the third data and the fourth data.

4. The nonvolatile memory device according to claim 1, wherein the time-digital converter further includes a first delay circuit that causes the second memory circuit to acquire the second data from the counter circuit after a predetermined period has elapsed from the input of the first end signal.

5. The nonvolatile memory device according to claim 4, wherein the first delay circuit delays the first end signal and outputs the delayed first end signal to the second memory circuit, and the second memory circuit acquires the second data from the counter circuit according to the delayed first end signal.

6. The nonvolatile memory device according to claim 4, wherein the time-digital converter further includes:

a first sampling memory circuit that stores, as first sampling data, at least one bit of the count value of the counter circuit according to the first end signal which is input without passing through the first delay circuit; and a first correction circuit that generates correction data from the first sampling data, the first data, and the second data, and the first digital value is generated from the first data and the correction data.

7. The nonvolatile memory device according to claim 2, wherein the time-digital converter further includes:

a first delay circuit that causes the second memory circuit to acquire the second data from the counter circuit after a predetermined period has elapsed from the input of the first end signal; and a second delay circuit that causes the fourth memory circuit to acquire the fourth data from the counter circuit after a predetermined period has elapsed from the input of the second end signal.

8. The nonvolatile memory device according to claim 7, wherein the first delay circuit delays the first end signal and outputs the delayed first end signal to the second memory circuit, the second memory circuit acquires the second data from the counter circuit according to the delayed first end signal, the second delay circuit delays the second end signal and outputs the delayed second end signal to the fourth memory circuit, and the fourth memory circuit acquires the fourth data from the counter circuit according to the delayed second end signal.

9. The nonvolatile memory device according to claim 7, wherein the time-digital converter further includes:

a first sampling memory circuit that stores, as first sampling data, at least one bit of the count value of the counter circuit according to the first end signal which is input without passing through the first delay circuit;

a first correction circuit that generates first correction data from the first sampling data, the first data, and the second data;

a second sampling memory circuit that stores, as second sampling data, at least one bit of the count value of the counter circuit according to the second end signal which is input without passing through the second delay circuit; and a second correction circuit that generates second correction data from the second sampling data, the third data, and the fourth data, the first digital value is generated from the first data and the first correction data, and the second digital value is generated from the third data and the second correction data.

10. The nonvolatile memory device according to claim 1, wherein the time-digital converter further includes:

a third memory circuit that stores, based on the start signal, the outputs of the delay elements as third data;

a fourth memory circuit that stores, based on the first data and the second data, the count value of the counter circuit as fourth data;

a first decoder that generates first decoder output based on the first data and the second data;

a second decoder that generates second decoder output based on the third data and the fourth data; and a first generation circuit that generates the first digital value from the first decoder output and the second decoder output.

11. The nonvolatile memory device according to claim 10, wherein time-digital converter further includes:

a first delay circuit that causes the second memory circuit to acquire the second data from the counter circuit after a predetermined period has elapsed from the input of the start signal; and a second delay circuit that causes the fourth memory circuit to acquire the fourth data from the counter circuit after a predetermined period has elapsed from the input of the first end signal.

12. The nonvolatile memory device according to claim 11, wherein the first delay circuit delays the start signal and outputs the delayed start signal to the second memory circuit, the second memory circuit acquires the second data from the counter circuit according to the delayed start signal, the second delay circuit delays the first end signal and outputs the delayed first end signal to the fourth memory circuit, and the fourth memory circuit acquires the fourth data from the counter circuit according to the delayed first end signal.

13. The nonvolatile memory device according to claim 11, wherein the time-digital converter further includes:

a first sampling memory circuit that stores, as first sampling data, at least one bit of the count value according to the start signal which is input without passing through the first delay circuit;

a first correction circuit that generates first correction data from the first sampling data, the first data, and the second data;

a first decoder that generates the first decoder output from the first data and the first correction data;

a the second sampling memory circuit that stores, as second sampling data, at least one bit of the count value according to the first end signal which is input without passing through the second delay circuit;

a second correction circuit that generates second correction data from the second sampling data, the third data, and the fourth data; and a second decoder that generates the second decoder output from the third data and the second correction data.

14. The nonvolatile memory device according to claim 10, further comprising:

a second nonvolatile memory that stores information in association with a resistance value of the second nonvolatile memory; and a second resistance-time converter that outputs a second end signal to the time digital converter at timing according to the resistance value of the second nonvolatile memory, the second resistance-time converter being connected to the second nonvolatile memory, wherein the time-digital converter further measures a second time from the input of the start signal to input of the second end signal and converts the measured second time into a second digital value, and the time-digital converter further includes:

a fifth memory circuit that stores, based on the second end signal, the outputs of the delay elements as fifth data;

a sixth memory circuit that stores, based on the second end signal, the count value of the counter circuit as sixth data;

a third decoder that generates third decoder output based on the fifth data and the sixth data; and a second generation circuit that generates the second digital value from the first decoder output and the third decoder output.

15. The nonvolatile memory device according to claim 14, wherein the time-digital converter further includes:

a first delay circuit that causes the second memory circuit to acquire the second data from the counter circuit after a predetermined period has elapsed from the input of the start signal;

a second delay circuit that causes the fourth memory circuit to acquire the fourth data from the counter circuit after a predetermined period has elapsed from the input of the first end signal; and a third delay circuit that causes the sixth memory circuit to acquire the sixth data from the counter circuit after a predetermined period has elapsed from the input of the second end signal.

16. The nonvolatile memory device according to claim 15, wherein the first delay circuit delays the start signal and outputs the delayed start signal to the second memory circuit, the second memory circuit acquires the second data from the counter circuit according to the delayed start signal, the second delay circuit delays the first end signal and outputs the delayed first end signal to the fourth memory circuit, the fourth memory circuit acquires the fourth data from the counter circuit according to the delayed first end signal, the third delay circuit delays the second end signal and outputs the delayed second end signal to the sixth memory circuit, and the sixth memory circuit acquires the sixth data from the counter circuit according to the delayed second end signal.

17. The nonvolatile memory device according to claim 14, wherein the time-digital converter further includes:

a first sampling memory circuit that stores, as first sampling data, at least one bit of the count value according to the start signal which is input without passing through the first delay circuit;

a first correction circuit that generates first correction data from the first sampling data, the first data, and the second data;

a first decoder that generates the first decoder output from the first data and the first correction data;

a second sampling memory circuit that stores, as second sampling data, at least one bit of the count value according to the first end signal which is input without passing through the second delay circuit;

a second correction circuit that generates second correction data from the second sampling data, the third data, and the fourth data;

a second decoder that generates the second decoder output from the third data and the second correction data;

a third sampling memory circuit that stores, as third sampling data, at least one bit of the count value according to the second end signal which is input without passing through the third delay circuit;

a third correction circuit that generates third correction data from the third sampling data, the fifth data, and the sixth data; and a third decoder that generates the third decoder output from the fifth data and the third correction data.

18. The nonvolatile memory device according to claim 1, wherein the time-digital converter further includes an adjustment circuit that adjusts delay times of each of the delay elements.

19. The nonvolatile memory device according to claim 18, wherein the time-digital converter, in an adjustment mode, measures a time from input of a first test signal to input of a second test signal and converts the measured time into a digital value, the first test signal and the second test signal being generated based on a common reference signal.

determines whether or not the digital value is within a predetermined range, and adjusts the delay times of each of the delay elements if the digital value is determined not to be within the predetermined range.

20. An integrated circuit card, comprising the nonvolatile memory device according to claim 1.

* * * * *